US012757372B2

(12) United States Patent
Lin

(10) Patent No.: US 12,757,372 B2
(45) Date of Patent: Oct. 6, 2026

(54) MEMORY DEVICE WITH CONTAINER-SHAPED ELECTRODE AND METHOD FOR FABRICATING THE SAME

(71) Applicant: NANYA TECHNOLOGY CORPORATION, New Taipei City (TW)

(72) Inventor: Yuan-Yuan Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 366 days.

(21) Appl. No.: 18/584,150

(22) Filed: Feb. 22, 2024

(65) Prior Publication Data

US 2025/0275211 A1 Aug. 28, 2025

(51) Int. Cl.
*H10D 64/20* (2025.01)
*H10B 12/00* (2023.01)
(Continued)

(52) U.S. Cl.
CPC ............ *H10D 64/20* (2025.01); *H10B 12/31* (2023.02); *H10D 62/115* (2025.01); *H10D 64/031* (2025.01)

(58) Field of Classification Search
CPC .... H10D 64/20; H10D 62/115; H10D 64/031; H10B 12/31
(Continued)

(56) References Cited

U.S. PATENT DOCUMENTS 6,281,091 B1 * 8/2001 Durcan ................ H10B 12/485 257/E27.087
6,395,600 B1 * 5/2002 Durcan ................ H10B 12/485 438/254
(Continued)

FOREIGN PATENT DOCUMENTS

TW 200903727 A 1/2009
TW 201906089 A 2/2019
(Continued)

OTHER PUBLICATIONS

Office Action and and the search report mailed on Feb. 5, 2025 related to Taiwanese Application No. 113115514.
(Continued)

*Primary Examiner* — Jami Valentine Miller
(74) *Attorney, Agent, or Firm* — Xuan Zhang

(57) ABSTRACT

The present application discloses a memory device and a method for fabricating the memory device. The memory device includes a substrate; a landing area positioned on the substrate; a bottom electrode positioned on the landing area, wherein the bottom electrode has a container-shaped profile; a support layer positioned over the substrate and laterally surrounded the bottom electrode; a dielectric structure including a dielectric layer conformally positioned on the bottom electrode and on a top surface of the support layer, and covering top corners of the support layer, and a plurality of dielectric portions conformally positioned on the dielectric layer and covering the top corners of the support layer; and a top electrode structure positioned on the dielectric structure. The dielectric portions are sandwiched by the top electrode structure and the dielectric layer. The top surface of the third support layer is higher than a top surface of the bottom electrode.

12 Claims, 34 Drawing Sheets

(51) Int. Cl.
*H10D 62/10* (2025.01)
*H10D 64/01* (2025.01)

(58) Field of Classification Search
USPC .......................................................... 257/213
See application file for complete search history.

(56) References Cited

U.S. PATENT DOCUMENTS

| | | | | |
|---|---|---|---|---|
| 9,972,626 B1 * | 5/2018 | Takesako | ............... | H10B 12/34 |
| 11,594,539 B2 * | 2/2023 | Huang | ............... | H10B 12/0335 |
| 2007/0069271 A1 * | 3/2007 | Kim | ................... | H10B 12/0335 257/E21.019 |
| 2019/0074440 A1 * | 3/2019 | Yang | ...................... | H10N 50/01 |
| 2021/0280773 A1 * | 9/2021 | Liao | ....................... | H10B 63/30 |
| 2022/0216196 A1 * | 7/2022 | Zhu | .................... | H10B 12/0335 |
| 2022/0367476 A1 * | 11/2022 | Huang | ............... | H10B 12/0335 |
| 2023/0126899 A1 * | 4/2023 | Ali | ......................... | H10D 1/692 257/532 |
| 2024/0332348 A1 * | 10/2024 | Kung | ..................... | H10D 1/716 |
| 2025/0275212 A1 * | 8/2025 | Lin | ........................ | H10D 64/20 |

FOREIGN PATENT DOCUMENTS

| | | |
|---|---|---|
| TW | 202245221 A | 11/2022 |
| TW | 202312505 A | 3/2023 |
| TW | 202343747 A | 11/2023 |

OTHER PUBLICATIONS

Summary translation of Office Action and and the search report mailed on Feb. 5, 2025 related to Taiwanese Application No. 113115514.

Office Action and and the search report mailed on May 14, 2025 related to Taiwanese Application No. 114101482.

Summary translation of Office Action and and the search report mailed on May 14, 2025 related to Taiwanese Application No. 114101482.

* cited by examiner

MEMORY DEVICE WITH CONTAINER-SHAPED ELECTRODE AND METHOD FOR FABRICATING THE SAME

TECHNICAL FIELD

The present disclosure relates to a memory device and a method for fabricating the memory device, and more particularly, to a memory device with a container-shaped electrode and a method for fabricating the memory device with the container-shaped electrode.

DISCUSSION OF THE BACKGROUND

Continuous advancements in technology have allowed capacitors to have increasingly high aspect ratios in fabrication of integrated circuits. A storage electrode of a memory device is shaped as a container. The advancements in technology are resulting in increasing heights of container-shaped storage nodes.

However, conventional etching techniques (particularly techniques for high-aspect-ratio etching) limit performance of memory devices. Specifically, a recess formed by the conventional etching techniques has a smaller dimension at a bottom, reducing a capacitance of a capacitor formed in the recess. In addition, some types of conventional wet etch techniques may cause significant material loss and device defects due to poor control.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a memory device including a substrate; a landing area positioned on the substrate; a bottom electrode positioned on the landing area, wherein the bottom electrode has a container-shaped profile; a support layer positioned over the substrate and laterally surrounded the bottom electrode; a dielectric structure including a dielectric layer conformally positioned on the bottom electrode and on a top surface of the support layer, and covering top corners of the support layer, and a plurality of dielectric portions conformally positioned on the dielectric layer and covering the top corners of the support layer; and a top electrode structure positioned on the dielectric structure. The plurality of dielectric portions are sandwiched by the top electrode structure and the dielectric layer. The top surface of the third support layer is higher than a top surface of the bottom electrode.

Another aspect of the present disclosure provides a memory device including a substrate; a landing area positioned on the substrate; a first support layer positioned on the substrate; a second support layer positioned over the first support layer; a third support layer positioned over the second support layer; a bottom electrode including a bottom portion horizontally positioned on the landing area, a first wall portion extending from the bottom portion along a first direction, a second wall portion extending from the bottom portion along the first direction and separated from the first wall portion, and a top portion connecting to the second wall portion, parallel to the bottom portion, and collectively covering a top corner of the third support layer with the second wall portion; a dielectric structure including a dielectric layer conformally positioned on the bottom electrode, and a dielectric portion positioned on the dielectric layer and covering the top corner of the third support layer; and a top electrode conformally positioned on the dielectric structure.

Another aspect of the present disclosure provides a method for fabricating a memory device including forming a landing area on a substrate; forming an energy-removable layer adjacent to the landing area; sequentially forming a first support layer, a first material layer, a second material layer, a second support layer, a third material layer, and a third support layer over the landing area, wherein the first material layer is doped with an N-type dopant and the third material layer is doped with a P-type dopant; forming a first recess to expose the landing area; forming a bottom electrode within the first recess; conformally forming a dielectric layer on the bottom electrode and on a top surface of the third support layer; forming a plurality of dielectric portions on top corners of the first recess; and conformally forming a top conductive layer on the dielectric layer and covering the plurality of dielectric portions; and forming a top electrode on the top conductive layer.

Due to the design of the memory device of the present disclosure, the overall thickness of the dielectric structure at the top corner of the third support layer is increased. As a result, the leakage current between the bottom electrode and the top electrode structure can be prevented or reduced. In addition, the first width of the lower portion of the top electrode structure is greater than the third width of the upper portion of the top electrode structure. Consequently, the capacitance of the capacitor structure can be improved. Furthermore, the air gap structure positioned between the plurality of landing areas can reduce the parasitic capacitance between the plurality of landing areas.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
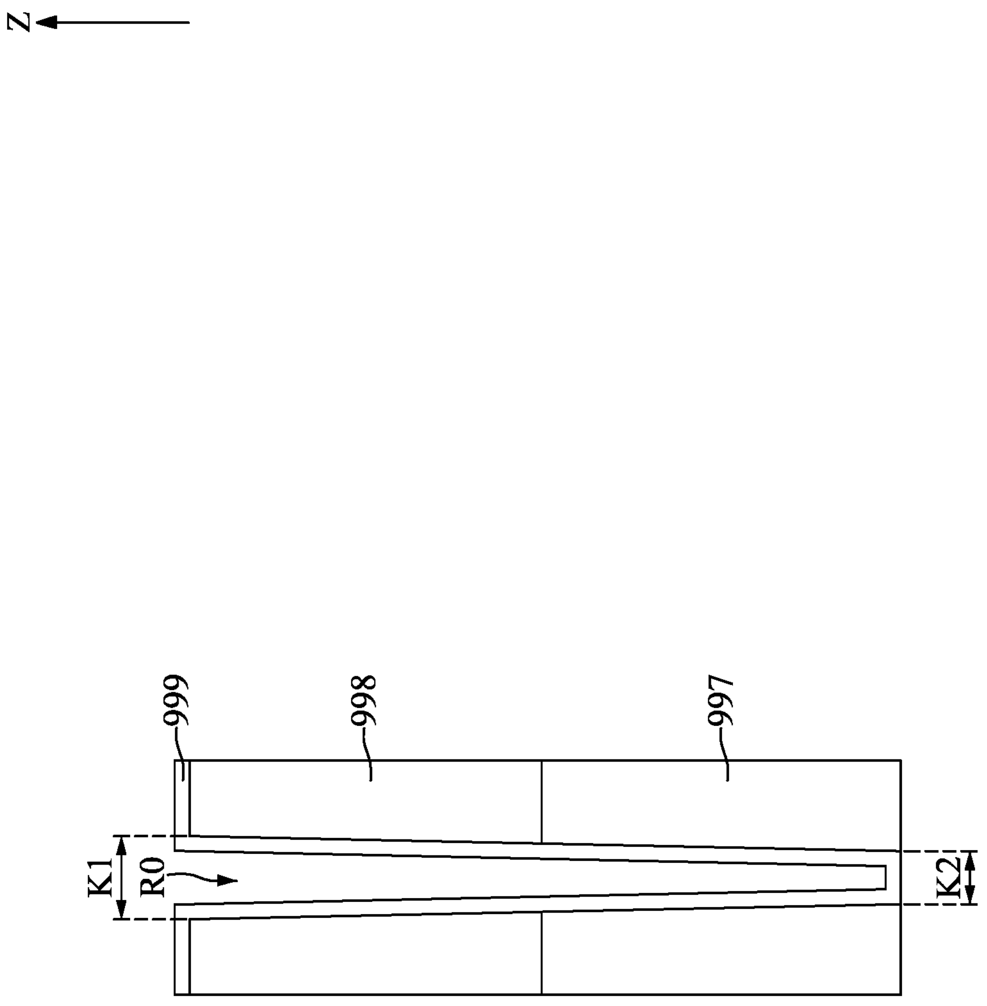
FIG. 1 is a cross-sectional view of a semiconductor device in accordance with a comparative embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that, in the description of the present disclosure, above (or up) corresponds to the direction of the arrow of the direction Z, and below (or down) corresponds to the opposite direction of the arrow of the direction Z.

FIG. 1 is a cross-sectional view of a semiconductor device in accordance with a comparative embodiment. For example, as shown in FIG. 1, a recess R0 is formed in an insulation stack, wherein the insulation stack includes a borophosphosilicate glass (BPSG) layer 997 and an oxide layer 998 over the BPSG layer 997. An electrode 999 is formed in the recess R0. However, a dimension K1 at a top of the recess R0 is substantially greater than a dimension K2 at a bottom of the recess R0. For example, the dimension K1 may be greater than the dimension K2 by 10 nm to 15 nm. Smaller values of the dimension K2 lead to lower capacitance of a capacitor further formed in the recess R0. Alternatively stated, a capacitance of a capacitor structure formed in the recess R0 may be severely limited due to a limitation of the dimension K2 at the bottom of the recess R0.

In addition, conventional wet etch techniques may cause significant material loss due to poor etch rate control. Alternatively stated, it is difficult to control a profile of the recess R0; for example, a bowing issue may occur at a position proximal to the top of the recess R0. Such issues may lead to poor device performance, or even cause electrical shorting between electrodes.

In order to meet cell capacitance requirements for advanced memory devices, such as dynamic random-access memory (DRAM) devices, a method for increasing capacitance is required. Accordingly, there is a need to develop a new memory device and a new method for forming the same. A first embodiment is depicted in FIGS. 2 to 25, and a second embodiment is depicted in FIGS. 26 to 34, wherein the second embodiment may further include operations depicted in FIGS. 3 to 15 that can be performed prior to the operations depicted in FIGS. 27 to 34.

Figure 2:
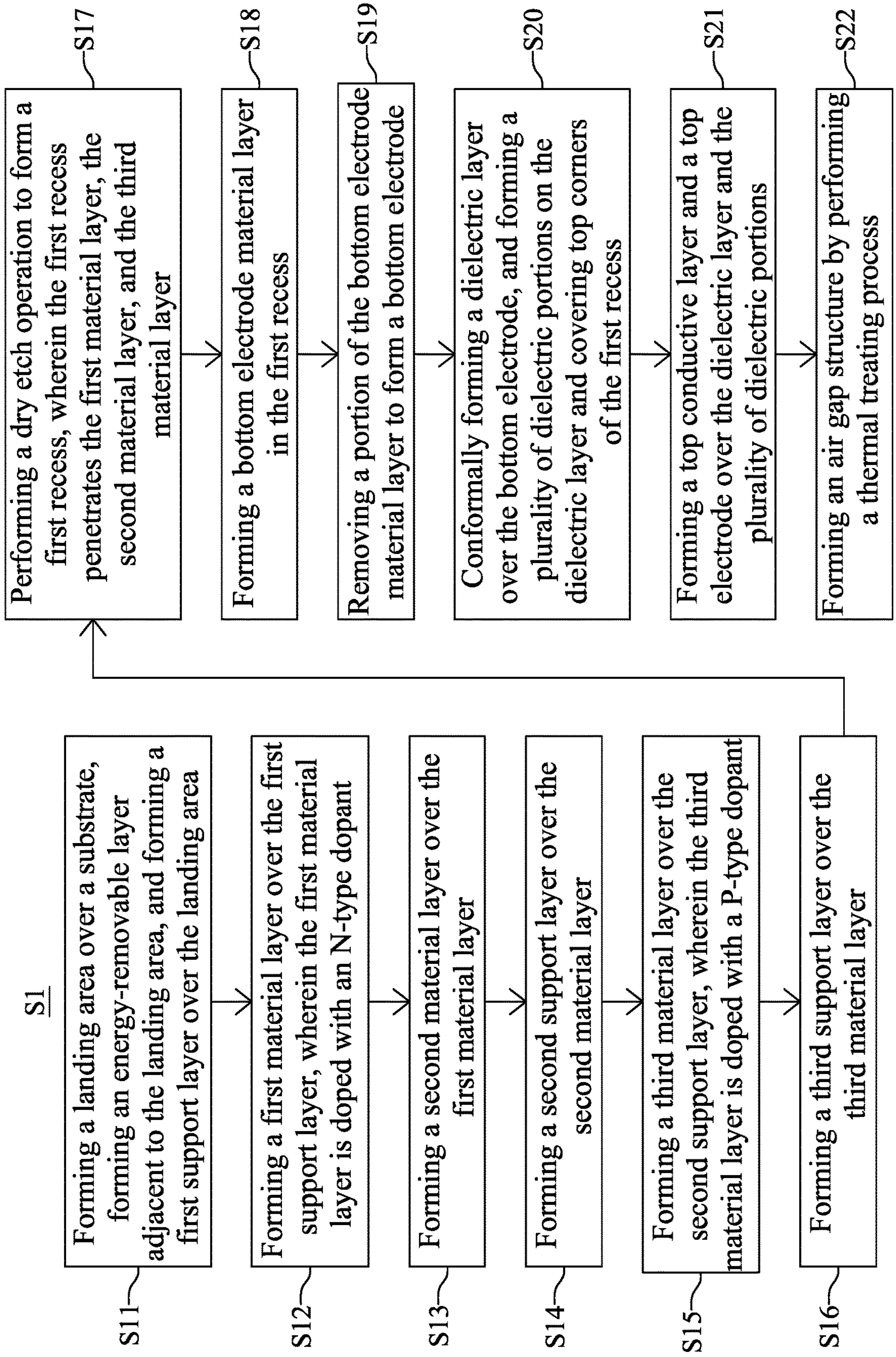
FIG. 2 is a flow diagram illustrating a method of manufacturing a memory device in accordance with some embodiments of the present disclosure.

FIG. 2 is a flow diagram illustrating a method S1 of manufacturing a memory device in accordance with some embodiments of the present disclosure. The method S1 includes a number of operations (S11, S12, S13, S14, S15, S16, S17, S18, S19, S20, S21, and S22) and the description and illustration are not deemed as a limitation to the sequence of the operations. In the operation S11, a landing area is formed over a substrate, an energy-removable layer is formed adjacent to the landing area, and a first support layer is formed over the landing area. In the operation S12, a first material layer is formed over the first support layer, wherein the first material layer is doped with an N-type dopant. In the operation S13, a second material layer is formed over the first material layer. In the operation S14, a second support layer is formed over the second material layer. In the operation S15, a third material layer is formed over the second support layer, wherein the third material layer is doped with a P-type dopant. In the operation S16, a third support layer is formed over the third material layer. In the operation S17, a dry etch operation is performed to form a first recess, wherein the first recess penetrates the first material layer, the second material layer, and the third material layer. In the operation S18, a bottom electrode material layer is formed in the first recess. In the operation S19, a portion of the bottom electrode material layer is removed to form a bottom electrode. In the operation S20, a dielectric layer is conformally formed over the bottom electrode and a plurality of dielectric portions are formed on the dielectric layer and covering top corners of the first recess. In the operation S21, a top conductive layer and a top electrode are formed over the dielectric layer and the plurality of dielectric portions. In the operation S22, an air gap structure is formed by performing a thermal treating process.

FIGS. 3 to 25 are schematic diagrams illustrating various fabrication stages constructed according to the method S1 in accordance with some embodiments of the present disclosure.

Figure 3:
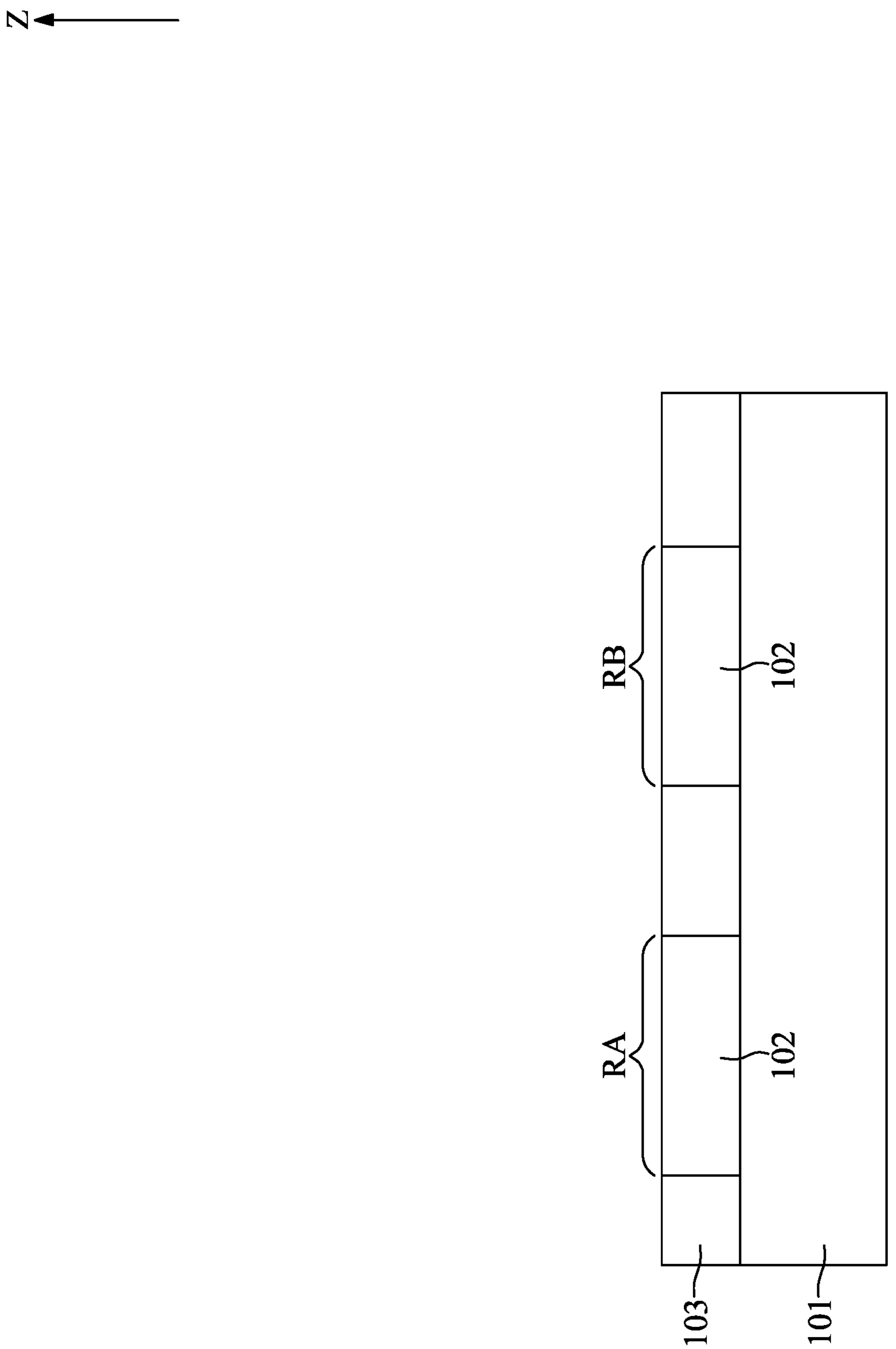
FIGS. 3 to 13 are cross-sectional diagrams of intermediate stages in the formation of the memory device in accordance with some embodiments of the present disclosure.

FIG. 3 is a cross-sectional diagram of an intermediate stage in the formation of a memory device in accordance with some embodiments of the present disclosure. In the operation S11, a substrate 101 is provided. An insulation layer 103 is formed over the substrate 101, and a plurality of landing areas 102 are formed in the insulation layer 103. For example, a landing area 102 is formed over a first region RA of the substrate 101, and another landing area 102 is formed over a second region RB that is different from the first region RA. In some embodiments, a chemical mechanical planarization (CMP) operation can be performed from above the insulation layer 103 and the landing areas 102. In some embodiments, the landing areas 102 include conductive material.

The substrate 101 may be a semiconductor substrate, such as a bulk semiconductor, a semiconductor-on-insulator (SOI) substrate, or the like. The substrate 101 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of silicon, SiGe, GaAsP, AlInAs, AlGaAs, GaInAs, GaInP, and GaInAsP; any other suitable materials; or a combination thereof. In some embodiments, the alloy semiconductor substrate may be a silicon alloy with a gradient silicon feature in which Si and metal compositions change from one ratio at one location to another ratio at another location of the gradient silicon feature. For example, the alloy semiconductor substrate may be a SiGe alloy with a gradient SiGe feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

In some embodiments, the substrate 101 may have a multilayer structure, or the substrate 101 may include a multilayer compound semiconductor structure. In some embodiments, the substrate 101 includes semiconductor devices, electrical components, electrical elements, or a combination thereof. In some embodiments, the substrate 101 includes transistors or functional units of transistors.

Figure 4:
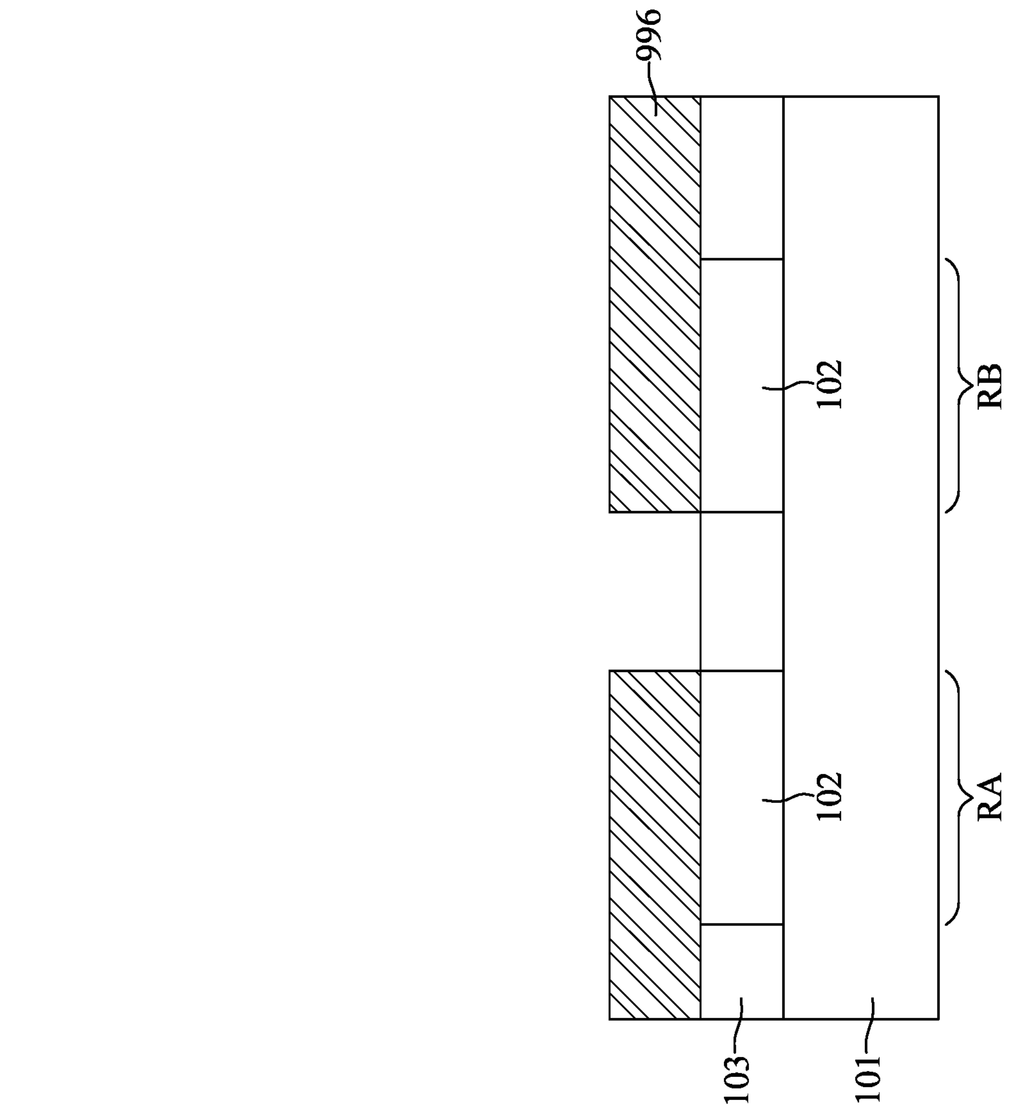

FIG. 4 is a cross-sectional diagram of an intermediate stage in the formation of a memory device in accordance with some embodiments of the present disclosure. A first mask layer 996 is formed on the insulation layer 103. The first mask layer 996 is a photoresist layer and has a pattern exposing a portion of the insulation layer 103 between the landing area 102 formed over the first region RA and the landing area 102 formed over the second region RB.

Figure 5:
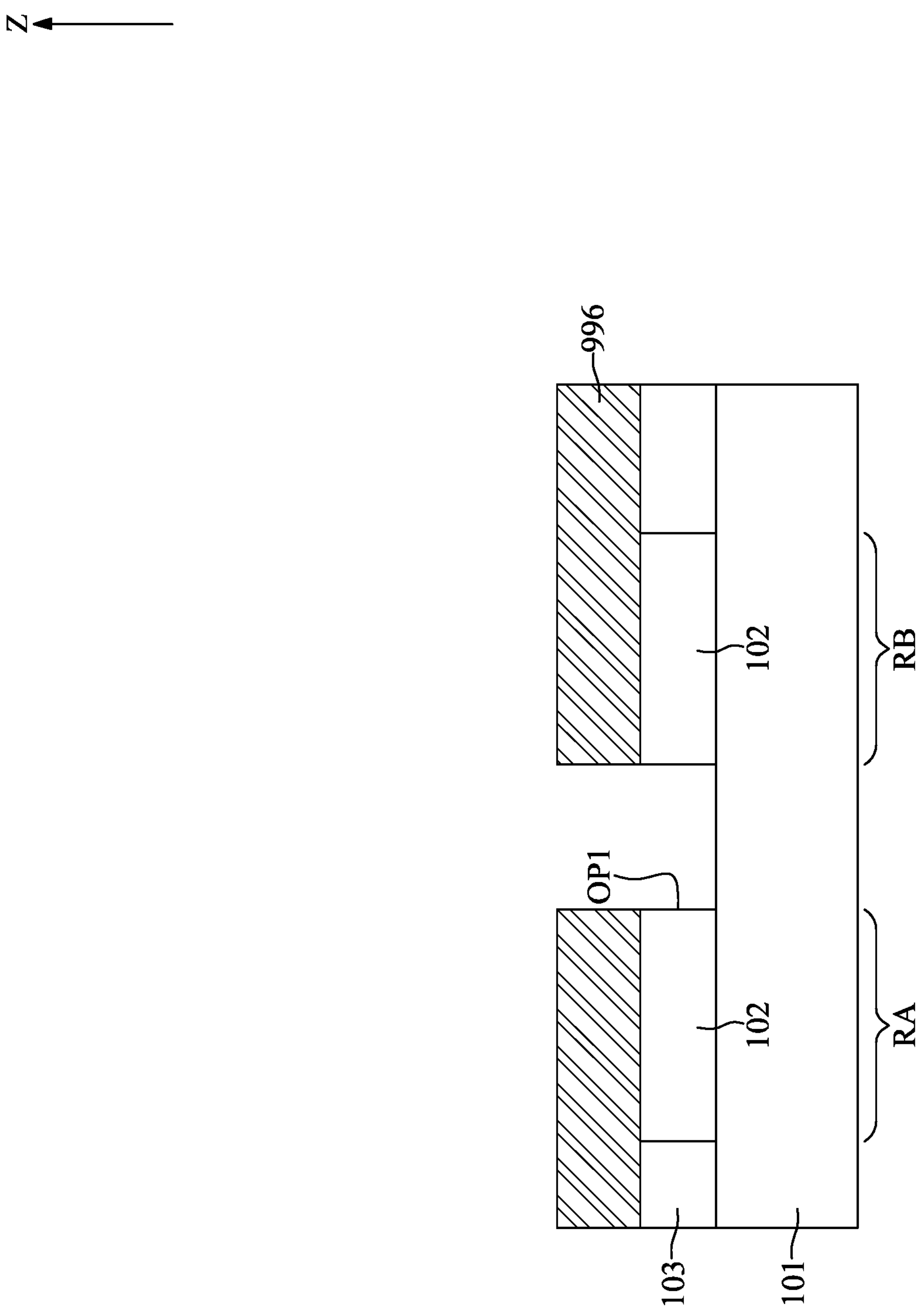

FIG. 5 is a cross-sectional diagram of an intermediate stage in the formation of a memory device in accordance with some embodiments of the present disclosure. A first opening OP1 is formed penetrating the insulation layer 103 by performing a dry etch operation.

In some embodiments, the dry etch operation may include applying plasma, such as fluorine-based plasma or fluorine-containing plasma. In some embodiments, a cleaning operation can be performed to remove residues generated in the dry etch operation. After the formation of the first opening OP1, the first mask layer 996 is removed.

Figure 6:
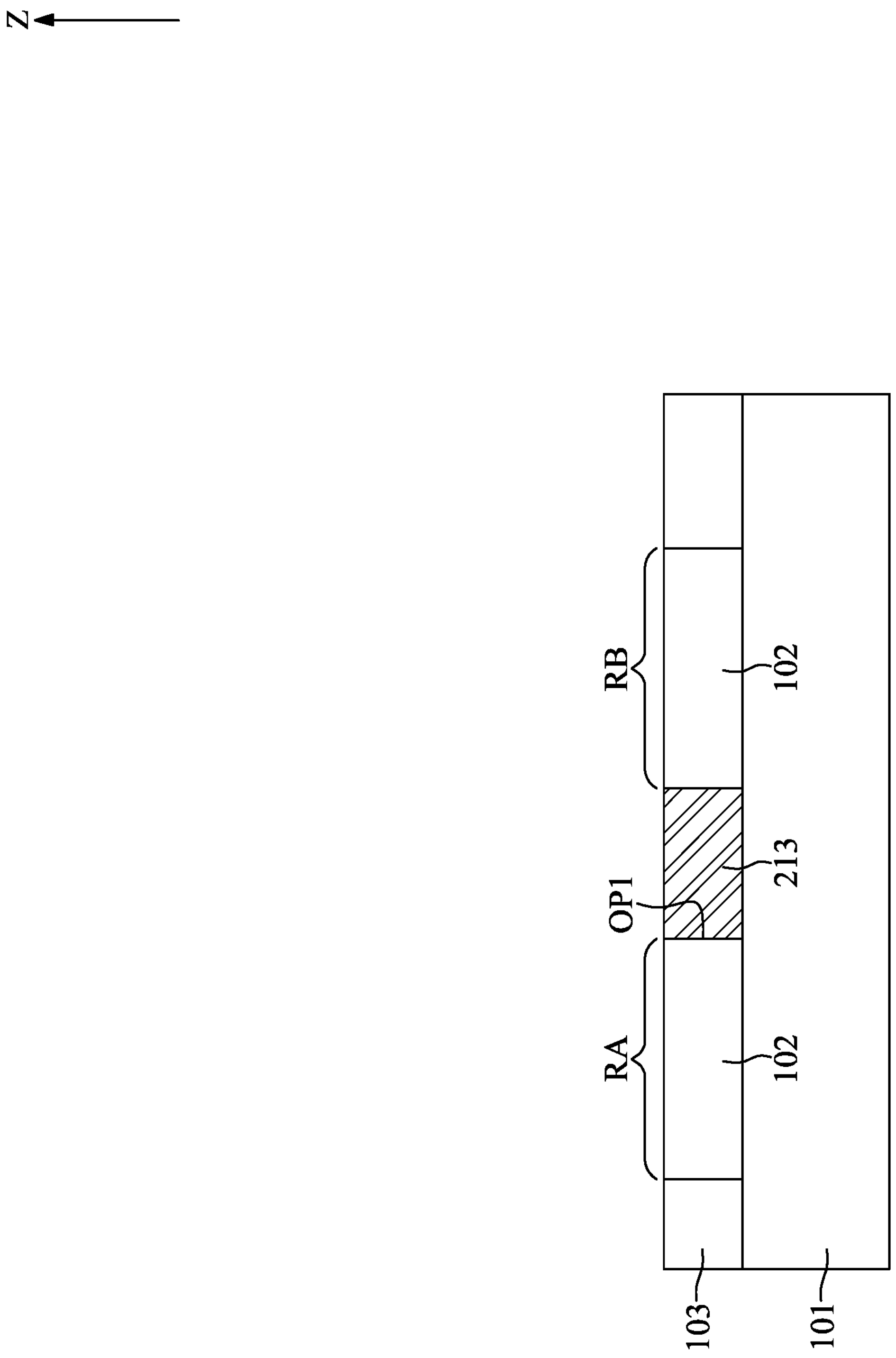

FIG. 6 is a cross-sectional diagram of an intermediate stage in the formation of a memory device in accordance with some embodiments of the present disclosure. In the operation S11, an energy-removable layer 213 is formed in the first opening OP1. A planarization operation is performed to provide a substantially flat surface for subsequent operations.

In some embodiments, the energy-removable layer 213 includes a thermal decomposable material. In some other embodiments, the energy-removable layer 213 includes a photonic decomposable material, an e-beam decomposable material, or another applicable energy decomposable material. Detailedly, in some embodiments, the energy-removable layer 213 includes a base material and a decomposable porogen material that is substantially removed once being exposed to an energy source (e.g., heat).

In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which can provide porosity to the space originally occupied by the energy-removable layer 213 in the subsequent operations.

Figure 7:
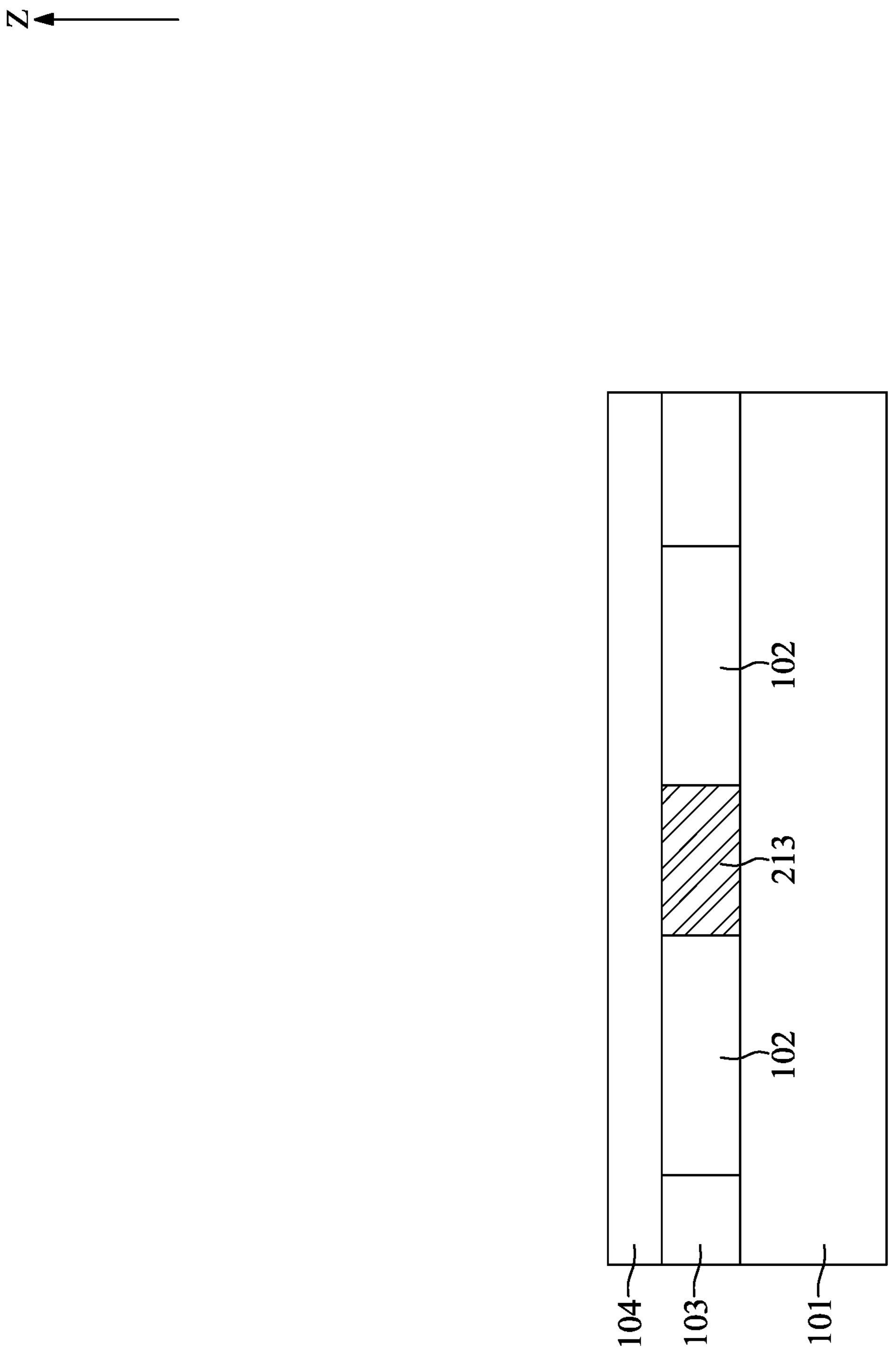

FIG. 7 is a cross-sectional diagram of an intermediate stage in the formation of a memory device in accordance with some embodiments of the present disclosure. In the operation S11, a first support layer 104 is formed over the substrate 101. The first support layer 104 extends over the insulation layer 103, the energy-removable layer 213, and the landing areas 102. In some embodiments, a material of the first support layer 104 includes silicon nitride (SiN). Alternatively, a material of the first support layer 104 can be another suitable material, such as an insulation material.

Figure 8:
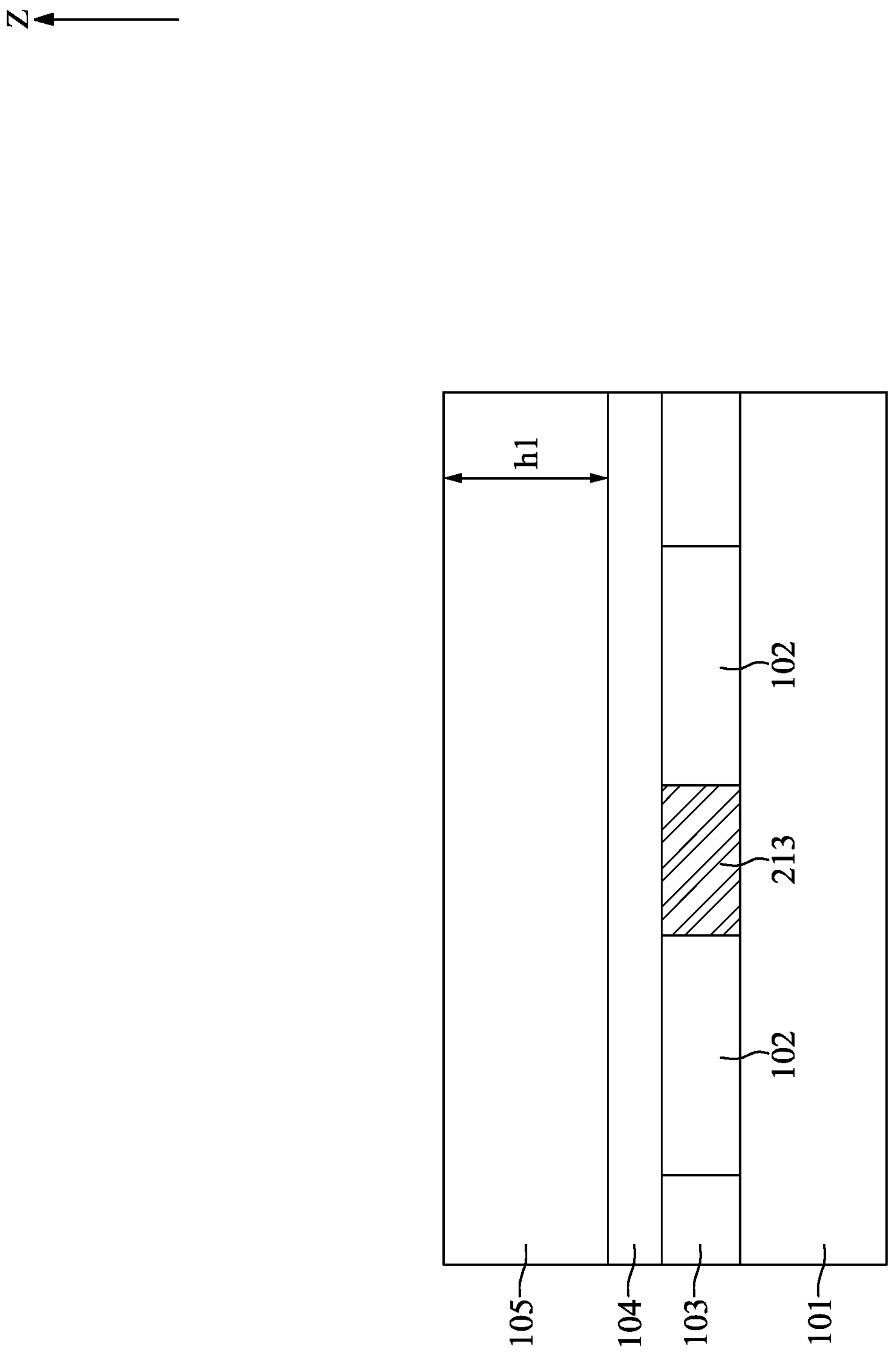

FIG. 8 is a cross-sectional diagram of an intermediate stage in the formation of a memory device in accordance with some embodiments of the present disclosure. In the operation S12, a first material layer 105 is formed over the first support layer 104, wherein the first material layer 105 is doped with an N-type dopant. For example, the first material layer 105 can be doped with phosphorus, arsenic, antimony, bismuth, or other suitable dopants. In some embodiments, the first material layer 105 includes polysilicon doped with an N-type dopant. The first material layer 105 has a first thickness h1. In some embodiments, the first thickness h1 of the first material layer 105 is less than 400 nm. In some embodiments, when the first material layer 105 is doped with phosphorus, a concentration of phosphorus dopant in the first material layer 105 is in a range from 5E14 atoms/cm3 to about 5E15 atoms/cm3.

Figure 9:
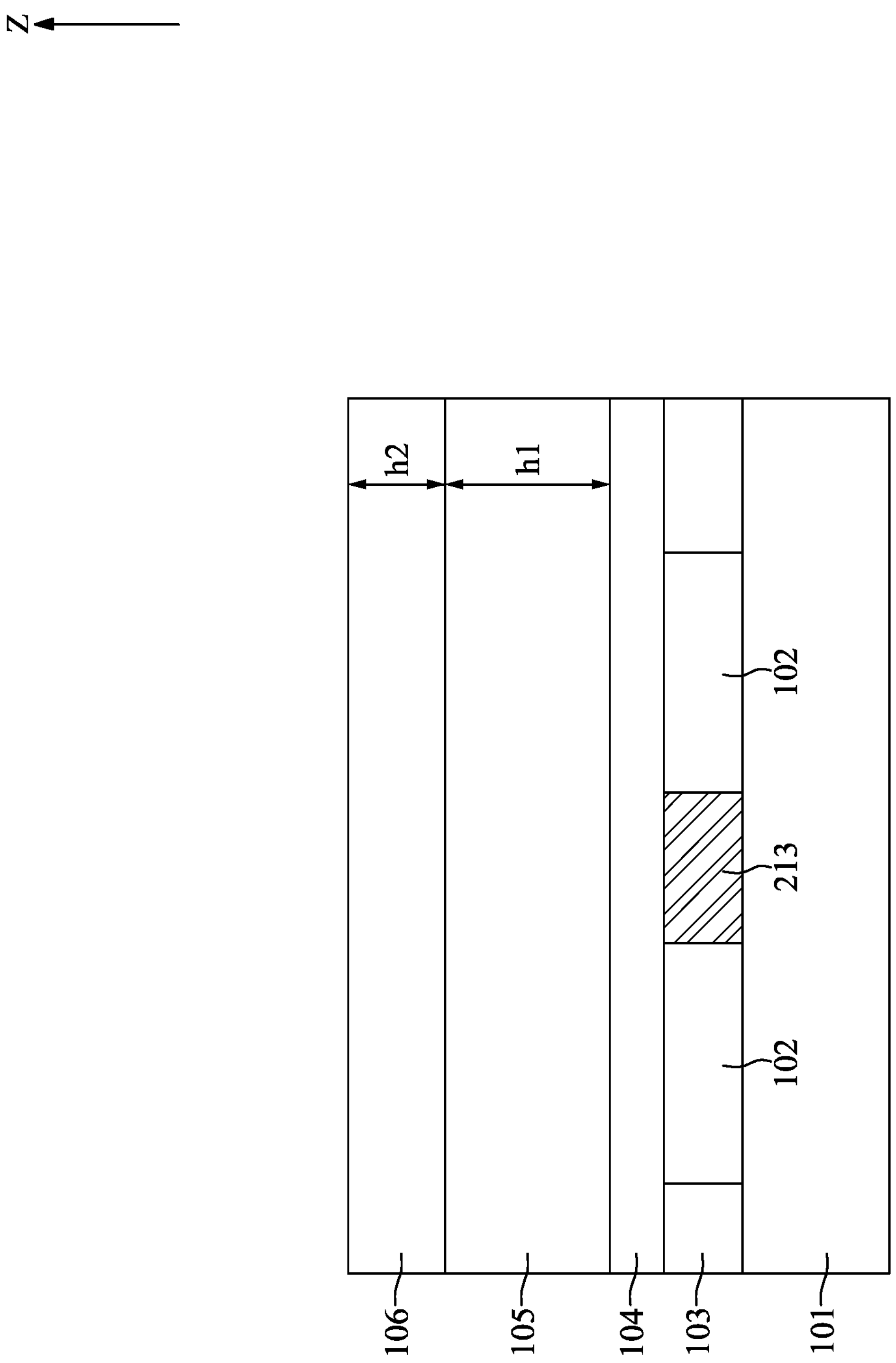

FIG. 9 is a cross-sectional diagram of an intermediate stage in the formation of a memory device in accordance with some embodiments of the present disclosure. In the operation S13, a second material layer 106 is formed over the first material layer 105. The second material layer 106 has a second thickness h2. In some embodiments, the second thickness h2 of the second material layer 106 is less than the first thickness h1 of the first material layer 105. In some embodiments, the second thickness h2 of the second material layer 106 is less than 200 nm. In some embodiments, the second material layer 106 includes undoped polysilicon (which can be referred to as intrinsic polysilicon), that is, without significant dopant therein. The second material layer 106 may be in direct contact with the first material layer 105.

Figure 10:
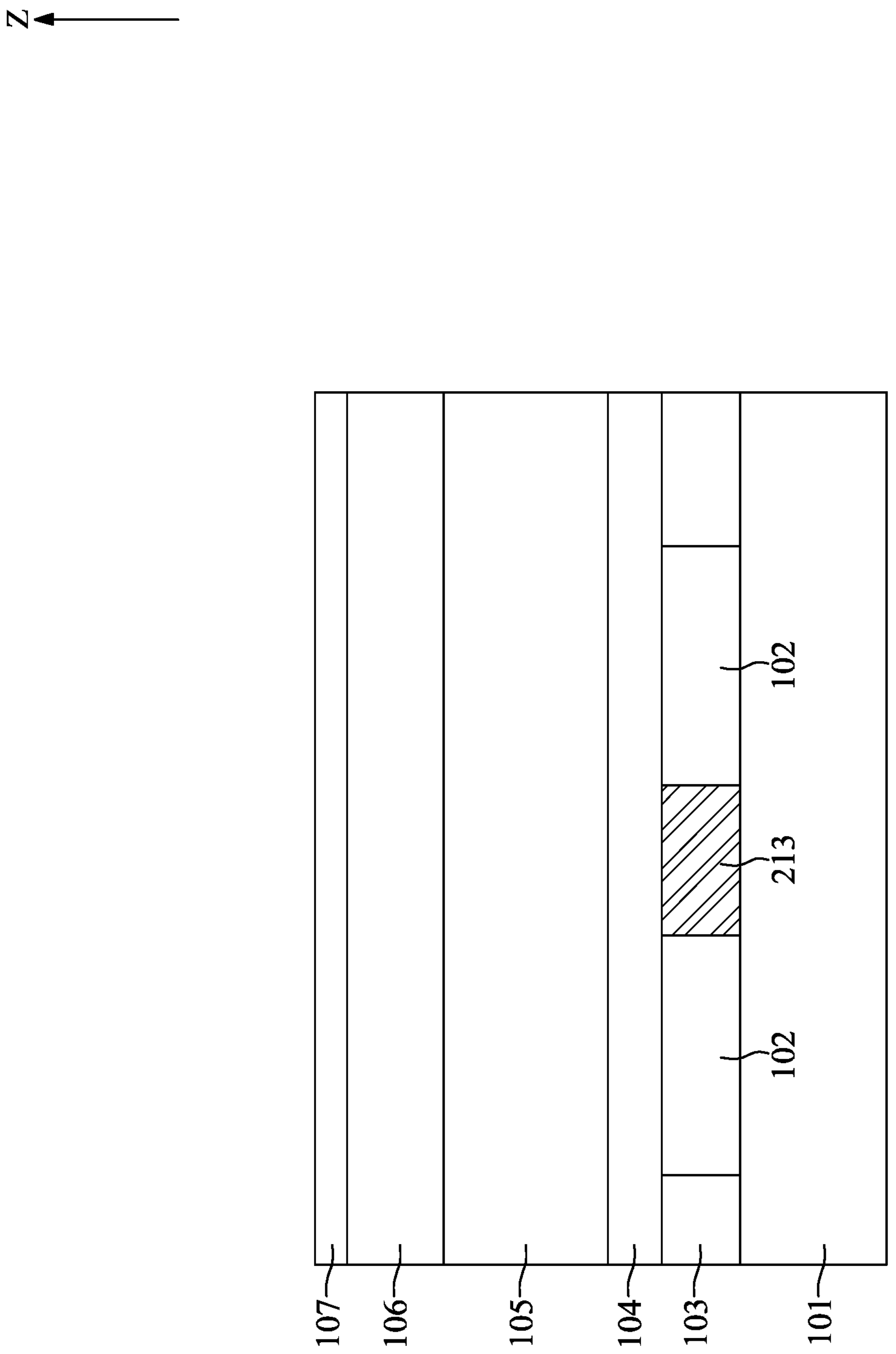

FIG. 10 is a cross-sectional diagram of an intermediate stage in the formation of a memory device in accordance with some embodiments of the present disclosure. In the operation S14, a second support layer 107 is formed over the second material layer 106. A material of the second support layer 107 may be identical to the material of the first support layer 104. In some embodiments, a material of the second support layer 107 includes silicon nitride (SiN).

Figure 11:
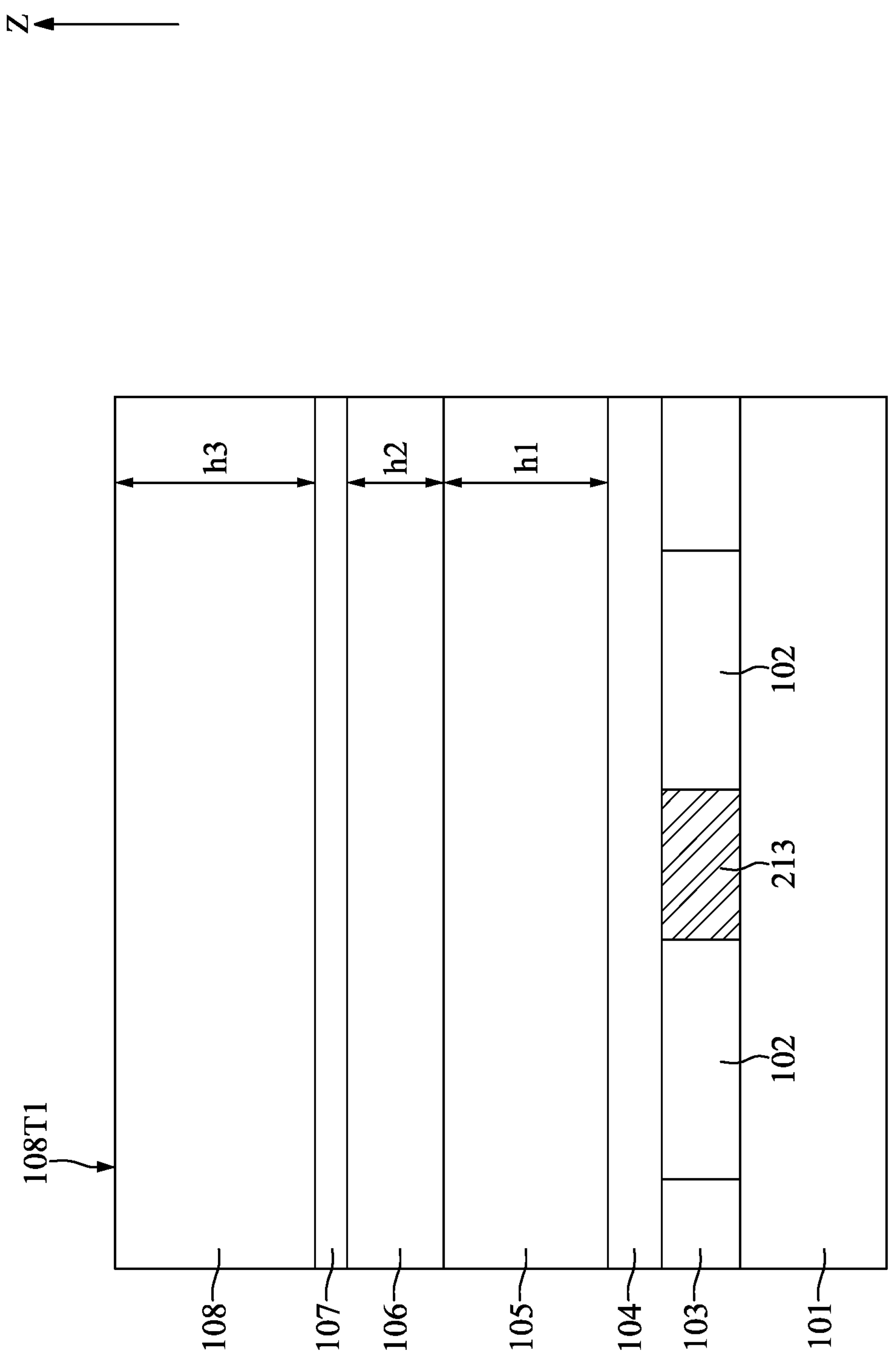

FIG. 11 is a cross-sectional diagram of an intermediate stage in the formation of a memory device in accordance with some embodiments of the present disclosure. In the operation S15, a third material layer 108 is formed over the second support layer 107, wherein the third material layer 108 is doped with a P-type dopant. For example, the third material layer 108 can be doped with boron, indium, gallium, or other suitable dopants. The third material layer 108 has a third thickness h3. In some embodiments, the third thickness h3 of the third material layer 108 is greater than the first thickness h1 of the first material layer 105. In some embodiments, the third thickness h3 of the third material layer 108 is greater than the second thickness h2 of the second material layer 106. In some embodiments, the third thickness h3 of the third material layer 108 is less than 500 nm. In some embodiments, a sum of the first thickness h1 of the first material layer 105 and the second thickness h2 of the second material layer 106 is greater than the third thickness h3 of the third material layer 108.

In some embodiments, the third material layer 108 includes polysilicon doped with a P-type dopant. In some embodiments, when the third material layer 108 is doped with boron, a concentration of boron dopant in the third material layer 108 is in a range from 5E14 atoms/cm$^3$ to about 5E15 atoms/cm$^3$. The third material layer 108 may be in direct contact with the second support layer 107. The third material layer 108 has a top surface 108T1.

Figure 12:
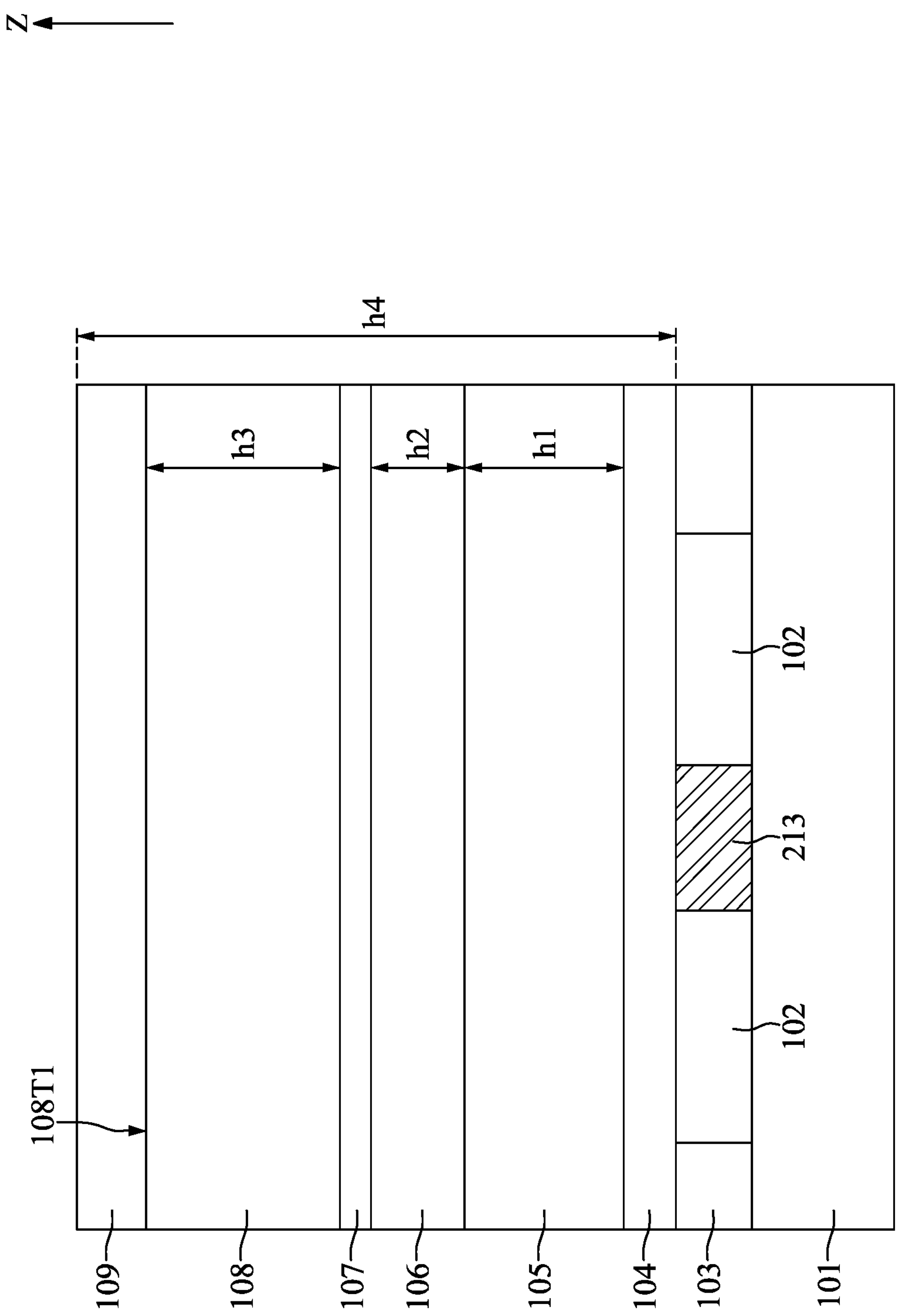

FIG. 12 is a cross-sectional diagram of an intermediate stage in the formation of a memory device in accordance with some embodiments of the present disclosure. In the operation S16, a third support layer 109 is formed over the top surface 108T1 of the third material layer 108. A material of the third support layer 109 may be identical to the material of the first support layer 104 or the material of the second support layer 107. In some embodiments, a material of the third support layer 109 includes silicon nitride (SiN). In some embodiments, a total thickness h4 of a stack of the first support layer 104, the first material layer 105, the second material layer 106, the second support layer 107, the third material layer 108, and the third support layer 109 may be in a range from 0.8 μm to about 1.2 μm.

Figure 13:
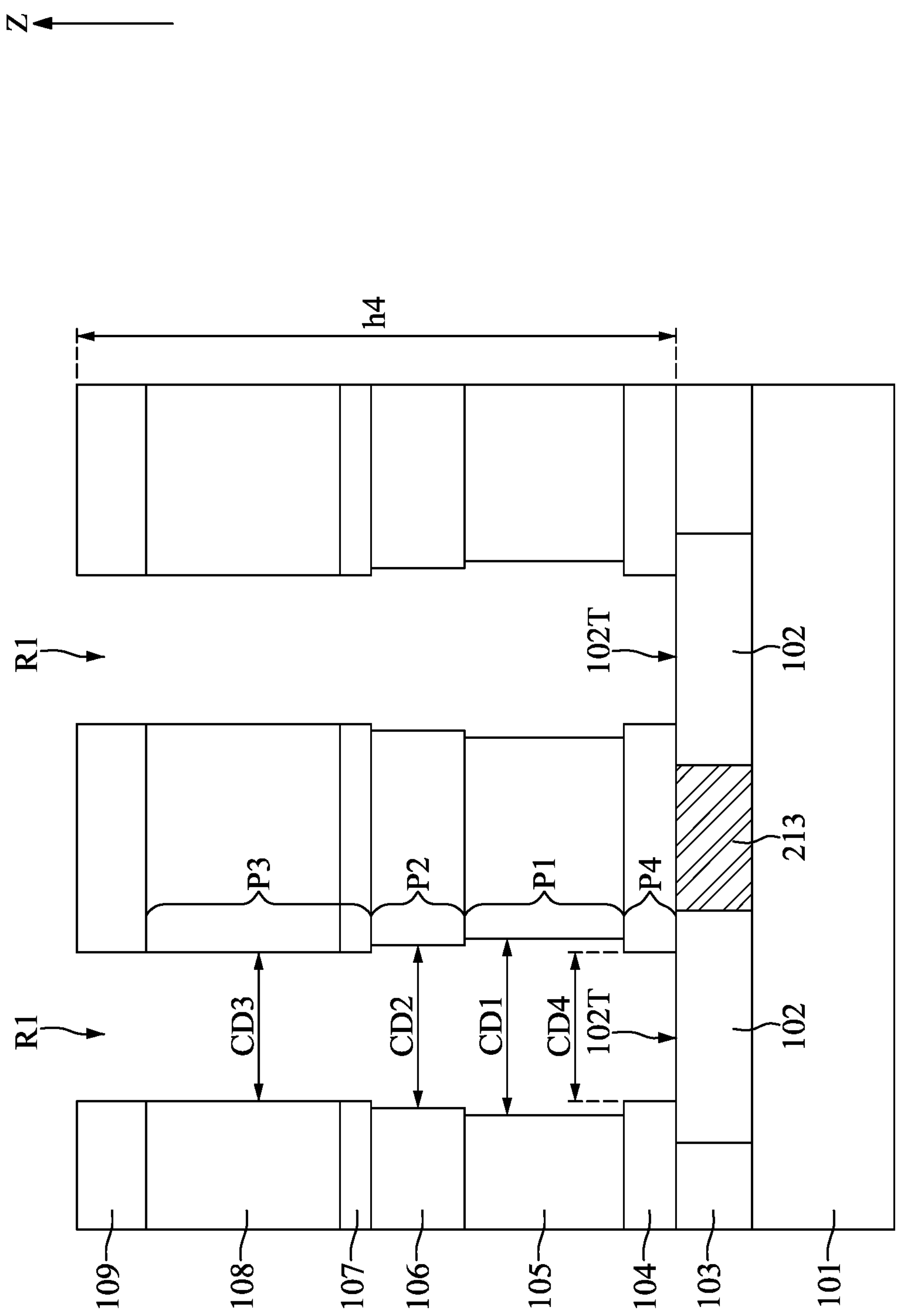
Figure 14:
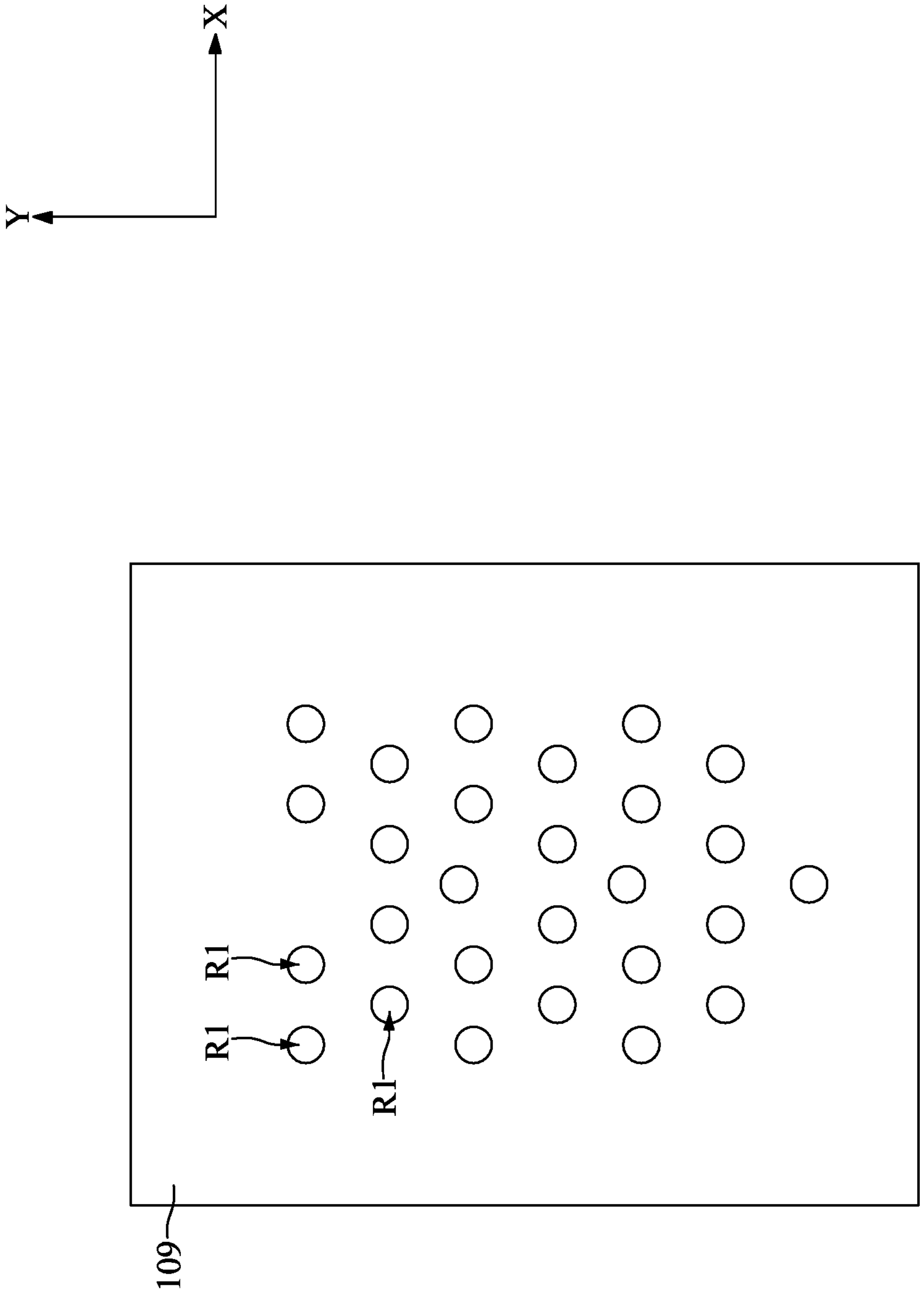
FIG. 14 is a top view perspective schematic diagram of an intermediate stage in the formation of the memory device shown in FIG. 13 in accordance with some embodiments of the present disclosure.

FIG. 13 is a cross-sectional diagram of an intermediate stage in the formation of a memory device in accordance with some embodiments of the present disclosure, and FIG. 14 is a top view perspective schematic diagram of an intermediate stage in the formation of a memory device shown in FIG. 13 in accordance with some embodiments of the present disclosure. In the operation S17, a plurality of first recesses R1 are formed over the substrate 101 by performing a dry etch operation. In some embodiments, the dry etch operation may include applying plasma, such as fluorine-based plasma or fluorine-containing plasma. In some embodiments, each of the plurality of first recesses R1 penetrates the first support layer 104, the first material layer 105, the second material layer 106, the second support layer 107, the third material layer 108, and the third support layer 109. The plurality of landing areas 102 are exposed through the plurality of first recesses R1. In some embodiments, one landing area 102 corresponds to one first recess R1. In some embodiments, positions of the plurality of first recesses R1 are defined by one or more lithography operation(s), and a cleaning operation can be performed to remove residues generated in the dry etch operation. In some embodiments, as depicted in FIG. 14, the plurality of first recesses R1 may be arranged in a staggered array. A position of each of the plurality of first recesses R1 corresponds to a position of one of the plurality of landing areas 102.

Each first recess R1 has a first portion P1 laterally surrounded by the first material layer 105, a second portion P2 laterally surrounded by the second material layer 106, a third portion P3 laterally surrounded by the third material layer 108, and a fourth portion P4 laterally surrounded by the first support layer 104. The third portion P3 is above the second portion P2, the second portion P2 is above the first portion P1, and the first portion PI is above the fourth portion P4.

An etch rate of the dry etch operation in the operation S17 on the first material layer 105 is greater than an etch rate of the dry etch operation on the second material layer 106. Further, the etch rate of the dry etch operation on the second material layer 106 is greater than an etch rate of the dry etch operation on the third material layer 108. Detailedly, by doping the first material layer 105 with an N-type dopant in a predetermined concentration, the etch rate of the dry etch operation in the operation S17 on the first material layer 105 in a lateral direction can be enhanced. In contrast, by doping the third material layer 108 with a P-type dopant in a predetermined concentration, the etch rate of the dry etch operation in the operation S17 on the third material layer 108 in a lateral direction can be reduced.

In some embodiments, an aspect ratio of one first recess R1 may be greater than 35. The present disclosure seeks to address an issue of the reduced dimension at the bottom of the recess in the comparative embodiment depicted in FIG. 1. That is, a recess formed by conventional techniques may result in a greater difference between a top dimension and a bottom dimension, which limits device performance. In contrast, a configuration of the first material layer 105, the second material layer 106, and the third material layer 108 can mitigate such issue and improve device performance.

Alternatively stated, by doping the first material layer 105 and the third material layer 108 with different types of dopants and disposing the second material layer 106 without significant doping between the first material layer 105 and the third material layer 108, profiles of the first recesses R1 can be improved.

Referring to FIG. 13, in some embodiments, a dimension CD1 of the first portion P1 is greater than a dimension CD2 of the second portion P2. In some embodiments, the dimension CD2 of the second portion P2 is greater than a dimension CD3 of the third portion P3. In some embodiments, the dimension CD1 of the first portion P1 is greater than a dimension CD4 of the fourth portion P4. In some embodiments, the dimension CD1 is greater than either the dimension CD2 or the dimension CD3. The aforementioned ranges of dopant concentrations in the material layers are designed to obtain desired values for the dimensions CD1, CD2 and CD3, with a difference between CD1 and CD3 within a predetermined range.

In some alternative embodiments, the dimension CD1 is comparable to the dimension CD2, and the dimension CD2 is comparable to the dimension CD3.

In some embodiments, a top surface 102T of each of the landing areas 102 is exposed through the fourth portion P4 of the first recess R1. A portion of each of the landing areas 102 may be covered by the first support layer 104.

Figure 15:
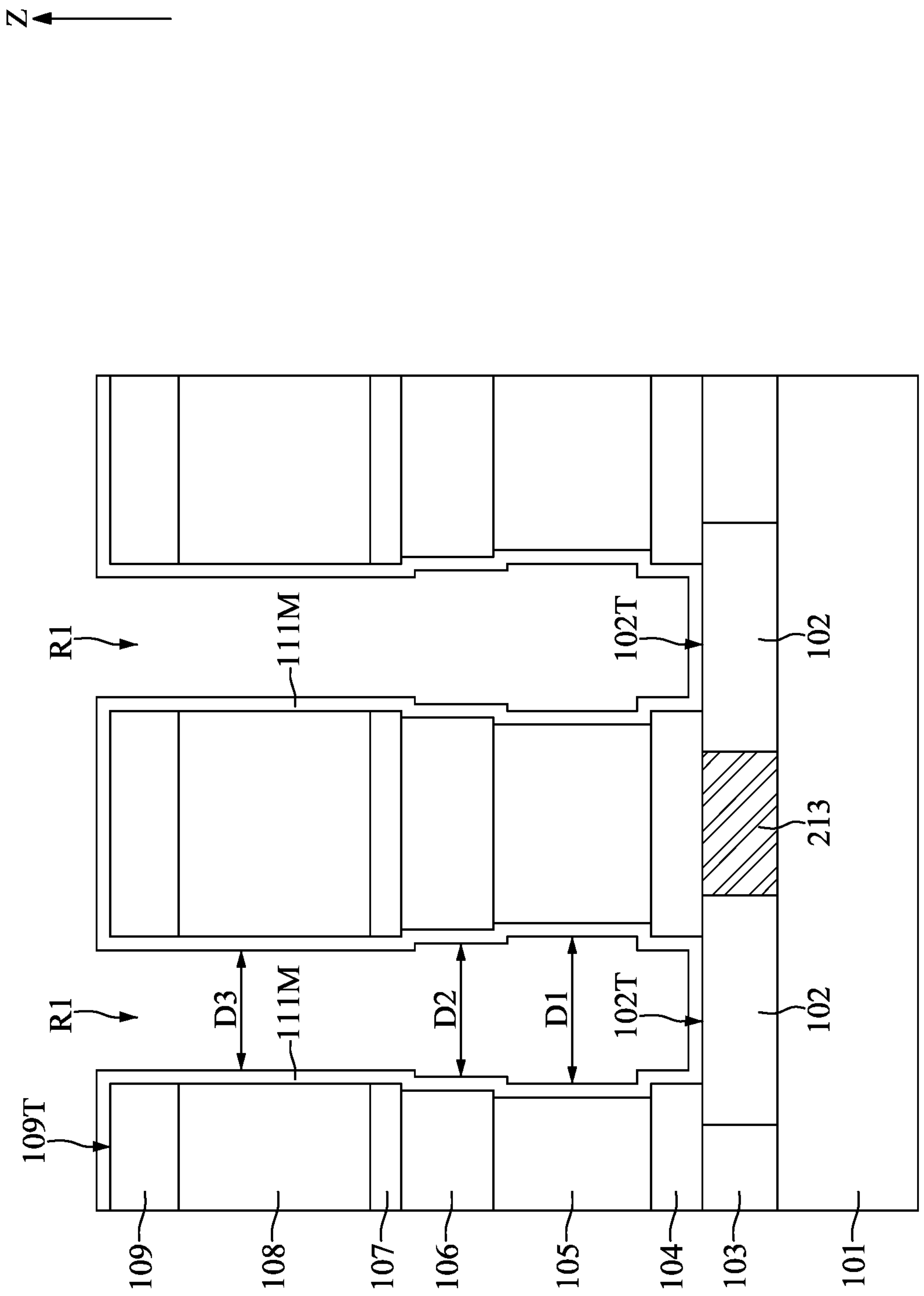
FIGS. 15 to 25 are cross-sectional diagrams of intermediate stages in the formation of the memory device in accordance with some embodiments of the present disclosure.

FIG. 15 is a cross-sectional diagram of an intermediate stage in the formation of a memory device in accordance with some embodiments of the present disclosure. In the operation S18, a bottom electrode material layer 111M is formed in the plurality of first recesses R1, thus causing the bottom electrode material layer 111M to have a container-shaped profile. In the present disclosure, the term "container-shaped" or "shaped as a container" may be referred to an object having a bottom and a sidewall portion extended from the bottom, and a portion of a space above the bottom is at least partially surrounded by the sidewall portion in lateral direction. The bottom electrode material layer 111M conforms to a profile of the first recess R1. In some embodiments, the bottom electrode material layer 111M further covers a top surface 109T of the third support layer 109 and the top surface 102T of each of the landing areas 102. In some embodiments, the bottom electrode material layer 111M may include titanium nitride (TiN) and may be formed by blanket deposition, chemical vapor deposition (CVD), physical vapor deposition (PVD), atomic layer deposition (ALD), or the like.

After the forming of the bottom electrode material layer 111M, the first portion P1 of the first recess R1 has a dimension D1, the second portion P2 of the first recess R1 has a dimension D2, and the third portion P3 of the first recess R1 has a dimension D3. In some embodiments, the dimension D3 of the third portion P3 is less than the dimension D2 of the second portion P2. In some embodiments, the dimension D2 of the second portion P2 is less than the dimension D1 of the first portion P1. In some embodiments, the dimension D1 is greater than either the dimension D2 or the dimension D3. In some embodiments, the dimension D3 is in a range from about 26 nm to about 36 nm in certain technology nodes, but the present disclosure is not limited thereto. In some embodiments, a difference between the dimension D3 and the dimension D1 is less than 10 nm, or in some cases, less than 5 nm.

In some alternative embodiments, the dimension D1 is comparable to the dimension D2, and the dimension D2 is comparable to the dimension D3.

In some embodiments, the dimensions D1, D2 and D3 represent a maximum width in a horizontal direction of an empty space of the first portion P1, the second portion P2, and the third portion P3, respectively, of the first recess R1.

Figure 16:
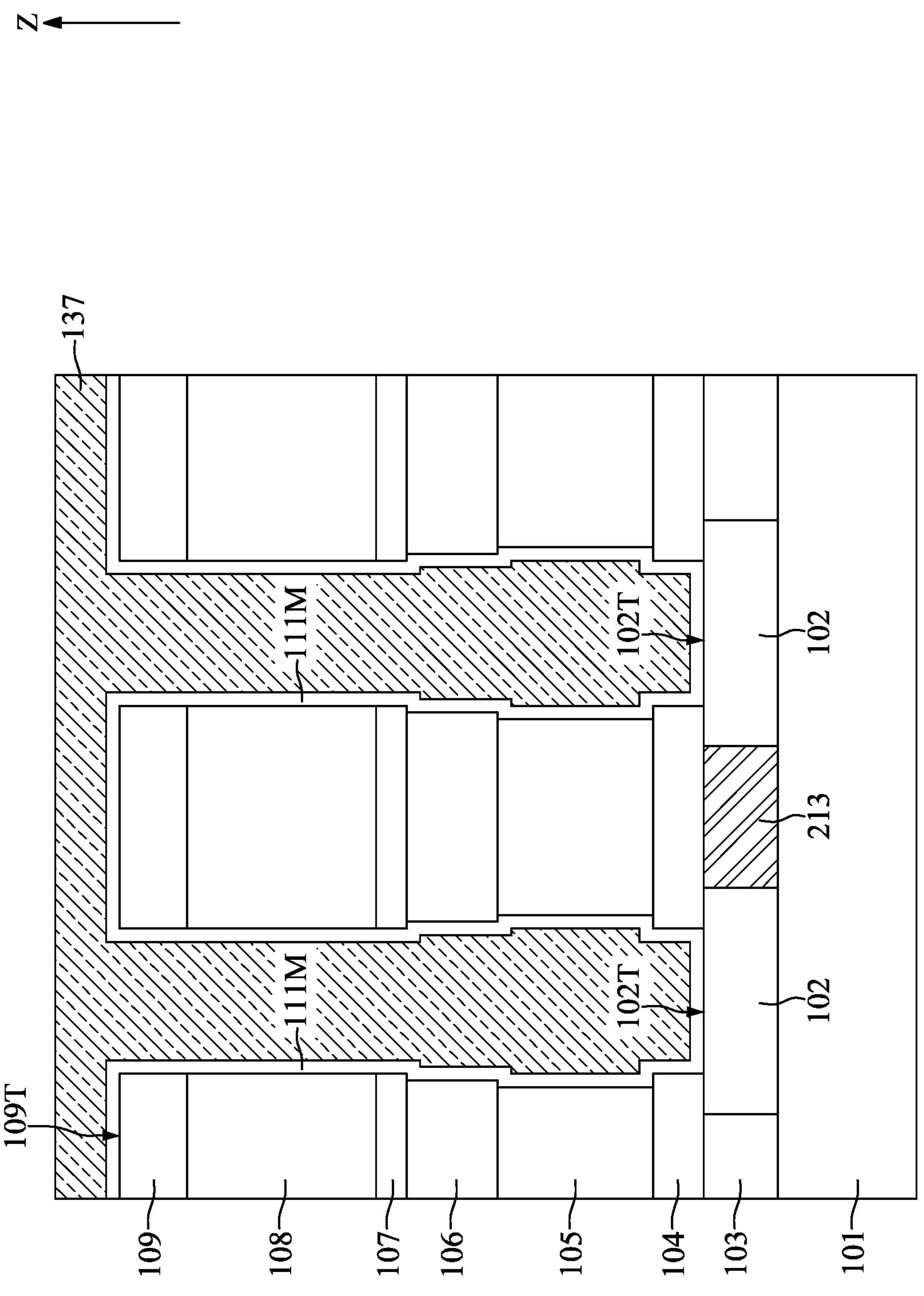

FIG. 16 is a cross-sectional diagram of an intermediate stage in the formation of a memory device in accordance with some embodiments of the present disclosure. A sacrificial material 137 is formed over the substrate 101 and fills the plurality of first recesses R1. In some embodiments, the bottom electrode material layer 111M is completely covered by the sacrificial material 137. In some embodiments, the sacrificial material 137 includes an oxide, such as silicon oxide. However, other materials, such as silicide nitride, silicon oxynitride, silicon carbonitride, combinations thereof, or the like, may alternatively be used for the sacrificial material 137. In some embodiments, the sacrificial material 137 is formed by a deposition process, such as a CVD process, a PVD process, or an ALD process.

Figure 17:
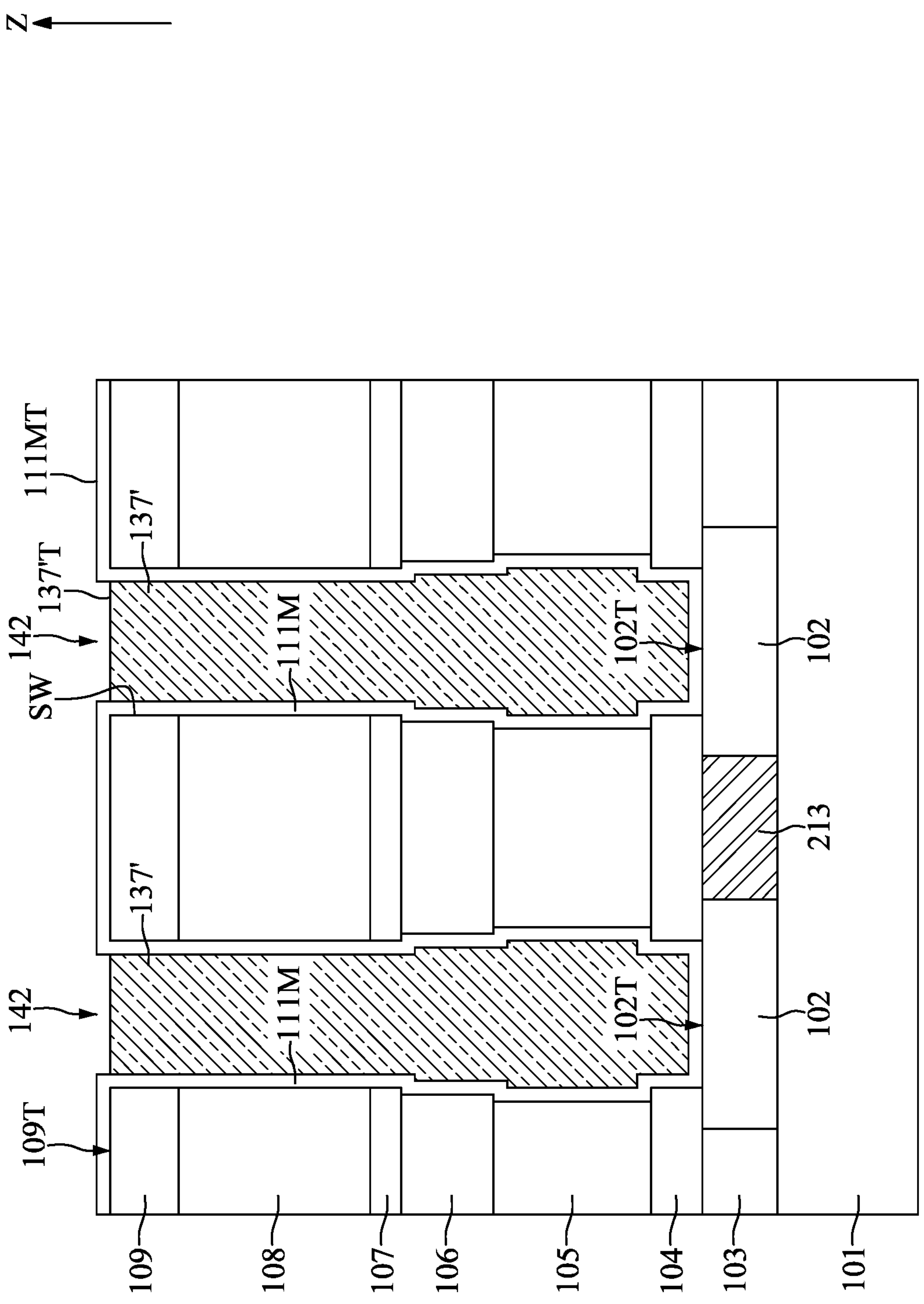

FIG. 17 is a cross-sectional diagram of an intermediate stage in the formation of a memory device in accordance with some embodiments of the present disclosure. An etch process is subsequently performed on the sacrificial material 137 to expose the bottom electrode material layer 111M, leaving a portion of the sacrificial material 137 in the plurality of first recesses R1, which is referred to as a sacrificial structure 137'. In the present embodiment, a portion of the sacrificial material 137 in the plurality of first recesses R1 is also removed such that a plurality of recesses 142 are formed over the sacrificial structure 137'.

In some embodiments, the top surface 111MT of the bottom electrode material layer 111M is higher than the top surface 137'T of the sacrificial structure 137'. In some embodiments, the top surface 109T of the third support layer 109 is higher than the top surface 137'T of the sacrificial structure 137'. That is, a portion of the bottom electrode material layer 111M covering the sidewalls SW of the plurality of first recesses R1 is exposed in the plurality of the recesses 142 over the sacrificial structure 137'. The etching process for forming the sacrificial structure 137' may be a wet etch process, a dry etch process, or a combination thereof.

Figure 18:
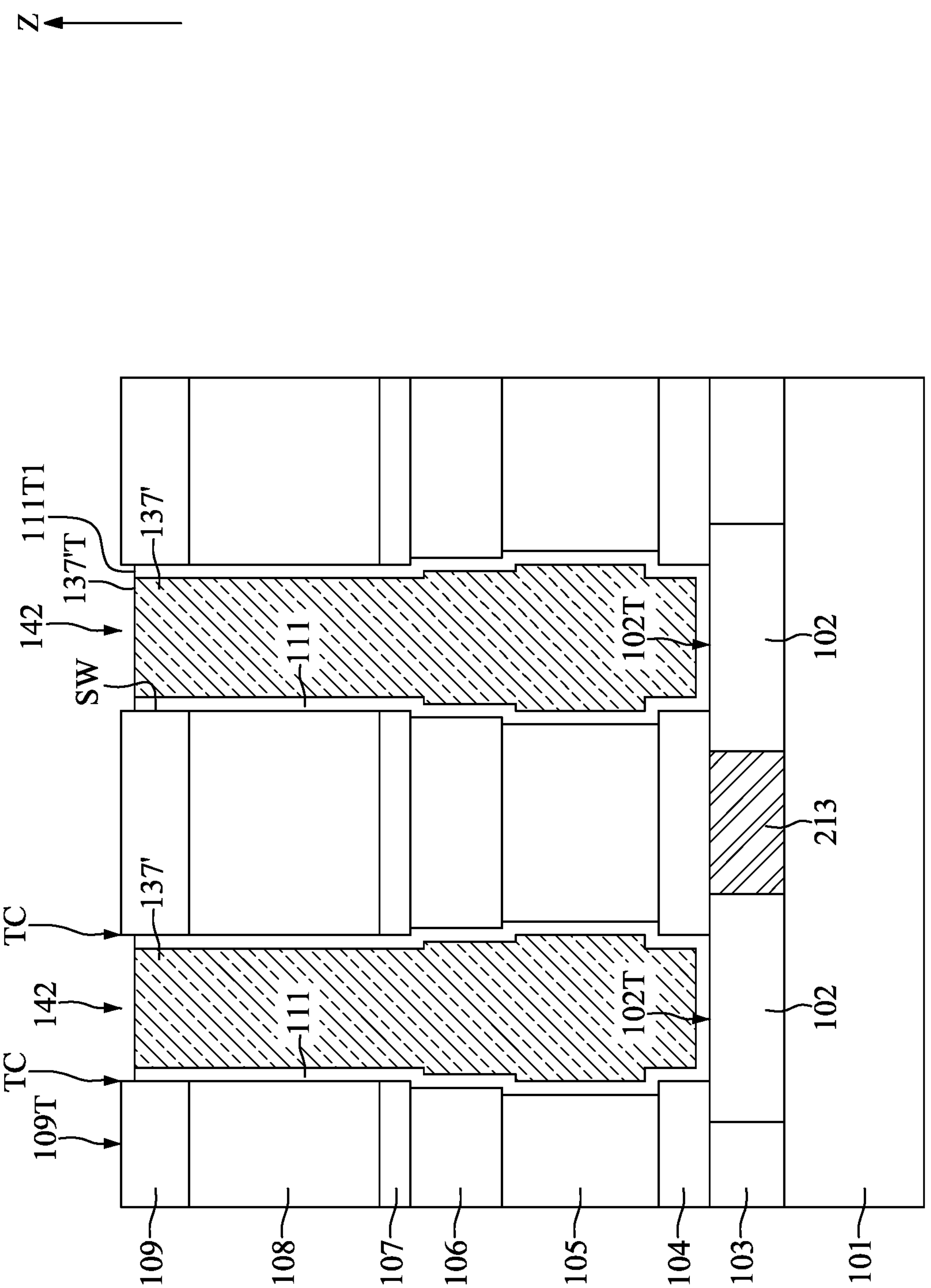

FIG. 18 is a cross-sectional diagram of an intermediate stage in the formation of a memory device in accordance with some embodiments of the present disclosure. In the operation S19, an etching process is performed to remove the exposed portions of the bottom electrode material layer 111M, leaving a portion of the bottom electrode material layer 111M in the plurality of first recesses R1, which is referred to as the plurality of bottom electrodes 111. In some embodiments, the plurality of bottom electrodes 111 cover the sidewalls SW of the plurality of first recesses R1 and the top surfaces 102T of the plurality of landing areas 102.

In some embodiments, the portion of the bottom electrode material layer 111M covering the top corners TC of the plurality of first recesses R1 is removed, and the top surfaces 111T1 of the plurality of bottom electrodes 111 are substantially coplanar with the top surfaces 137'T of the sacrificial structure 137'. Within the context of this disclosure, the word "substantially" means preferably at least 90%, more preferably 95%, even more preferably 98%, and most preferably 99%. In other words, each of the plurality of recesses 142 is laterally expanded, in accordance with some embodiments. Moreover, in some embodiments, the top surface 109T of the third support layer 109, and the top corners TC, and the upper portion of the sidewalls SW of the plurality of first recesses R1 are exposed. In some embodiments, the etching process for forming the plurality of bottom electrodes 111 includes one or more dry etching processes.

Figure 19:
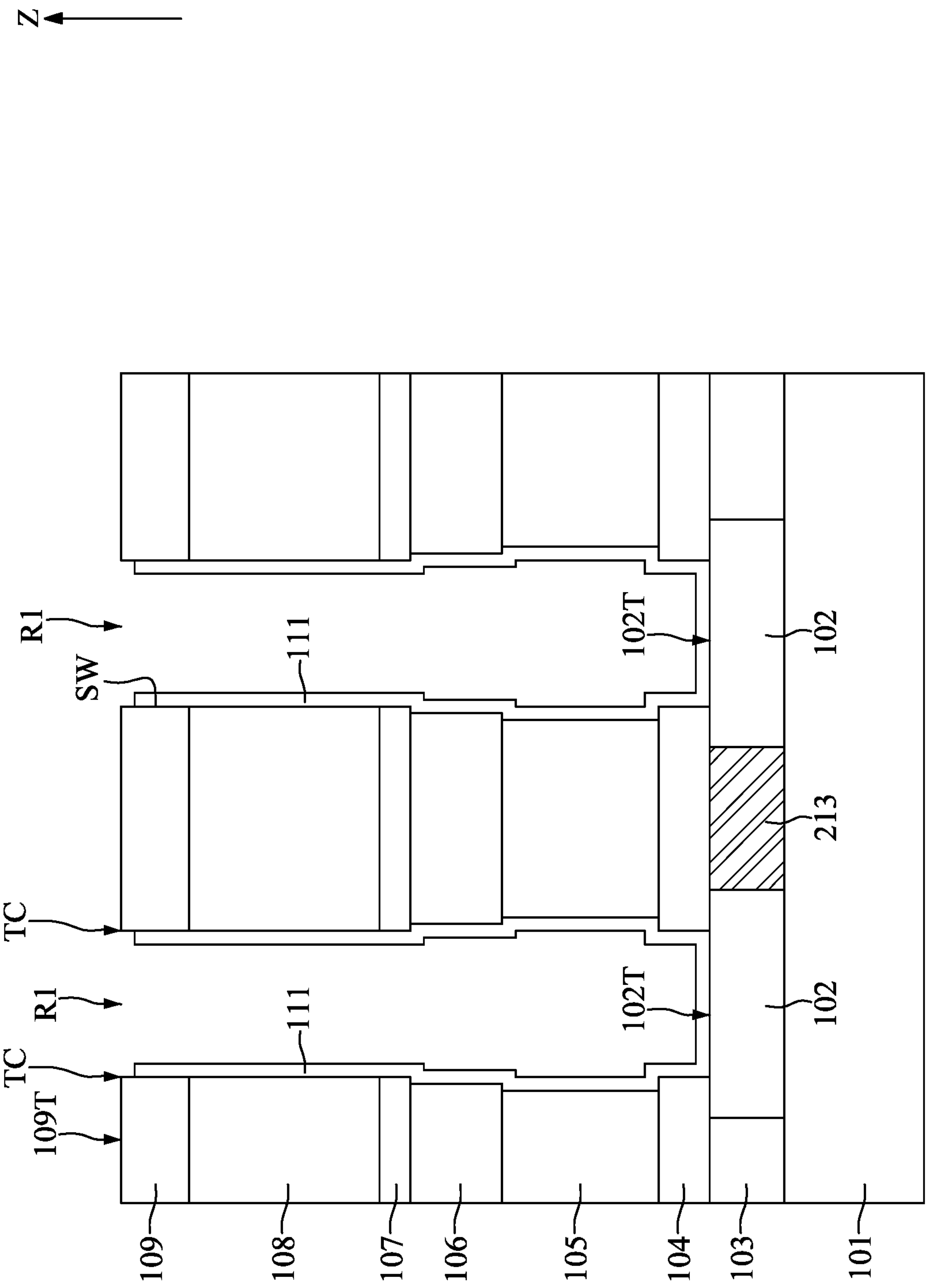

FIG. 19 is a cross-sectional diagram of an intermediate stage in the formation of a memory device in accordance with some embodiments of the present disclosure. An etch process is performed to remove the sacrificial structure 137'. In some embodiments, the etching selectivity of the sacrificial structure 137' with respect to the plurality of bottom electrodes 111 is relatively high. Therefore, the sacrificial structure 137' is removed by the etching process while the plurality of bottom electrodes 111 may be substantially left. In some embodiments, the etch process for removing the sacrificial structure 137' includes a wet etch process.

Figure 20:
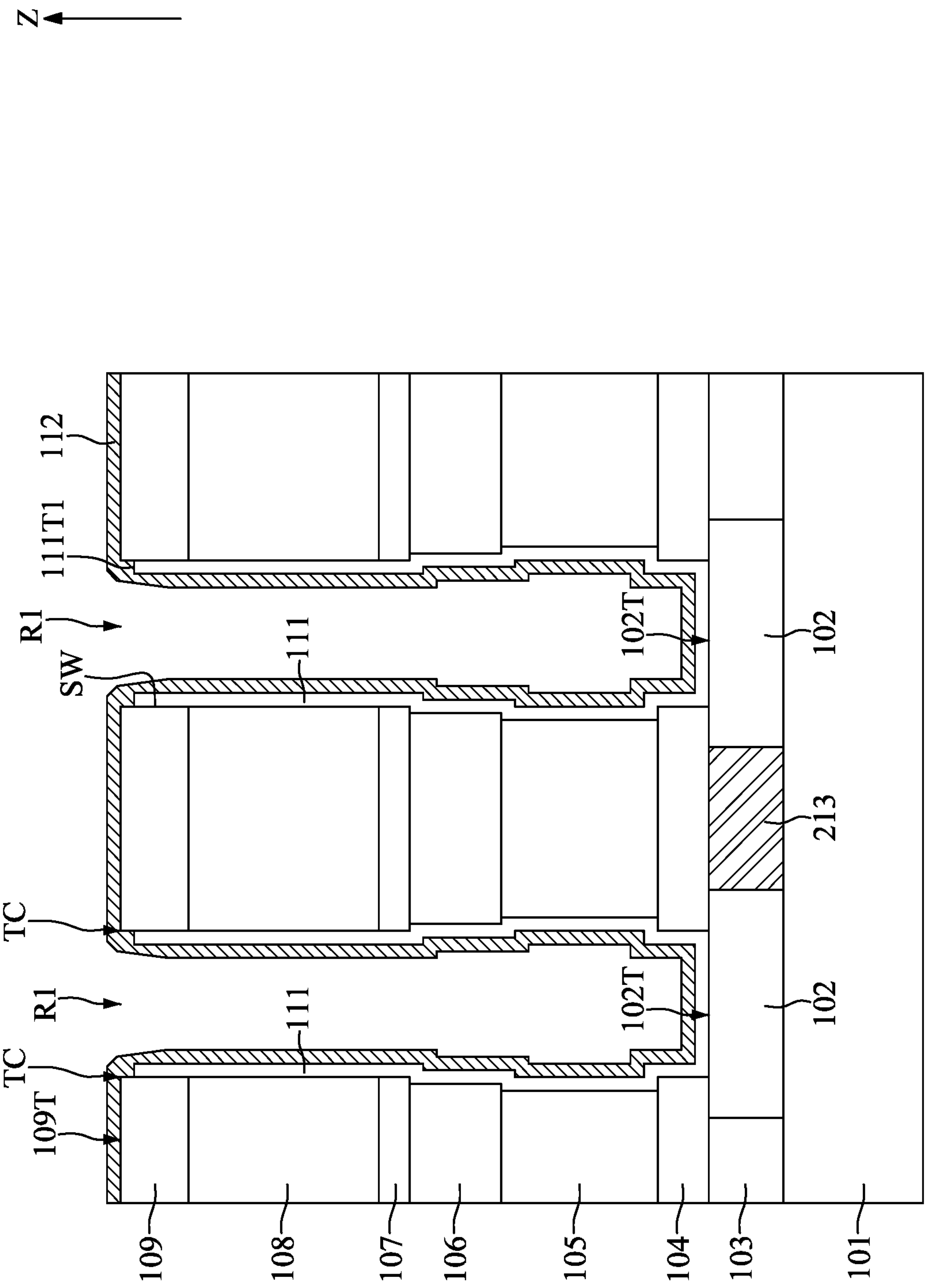

FIG. 20 is a cross-sectional diagram of an intermediate stage in the formation of a memory device in accordance with some embodiments of the present disclosure. In the operation S20, a dielectric layer 112 is conformally deposited over the top surface 109T of the third support layer 109 and covering the plurality of bottom electrodes 111. In some embodiments, the exposed top surfaces 109T of the third support layer 109 are completely covered by the dielectric layer 112. Moreover, in some embodiments, the top corners TC of the plurality of first recesses R1, the exposed portions of the sidewalls SW of the plurality of first recesses R1 and the top surfaces 111T1 of the plurality of bottom electrodes 111 are covered by the dielectric layer 112. In some embodiments, the top surfaces 109T of the third support layer 109, the top corners TC of the plurality of first recesses R1, the exposed portions of the sidewalls SW of the plurality of first recesses R1, and the top surfaces 111T1 of the plurality of bottom electrodes 111 are in direct contact with the dielectric layer 112.

In some embodiments, the dielectric layer 112 includes a single layer or multiple layers. In some embodiments, the dielectric layer 112 includes $SiO_2$, a dielectric material with high dielectric constant (high-k), such as $ZrO_2$, $HfO_2$, $TiO_2$, AlO, or a combination thereof. For example, the dielectric layer 112 may be a tri-layer structure including two layers of aluminum oxide and a layer of zirconium oxide disposed between them. Moreover, in some embodiments, the dielectric layer 112 is formed by a conformal deposition process, such as a CVD process, a PVD process, or an ALD process.

Figure 21:
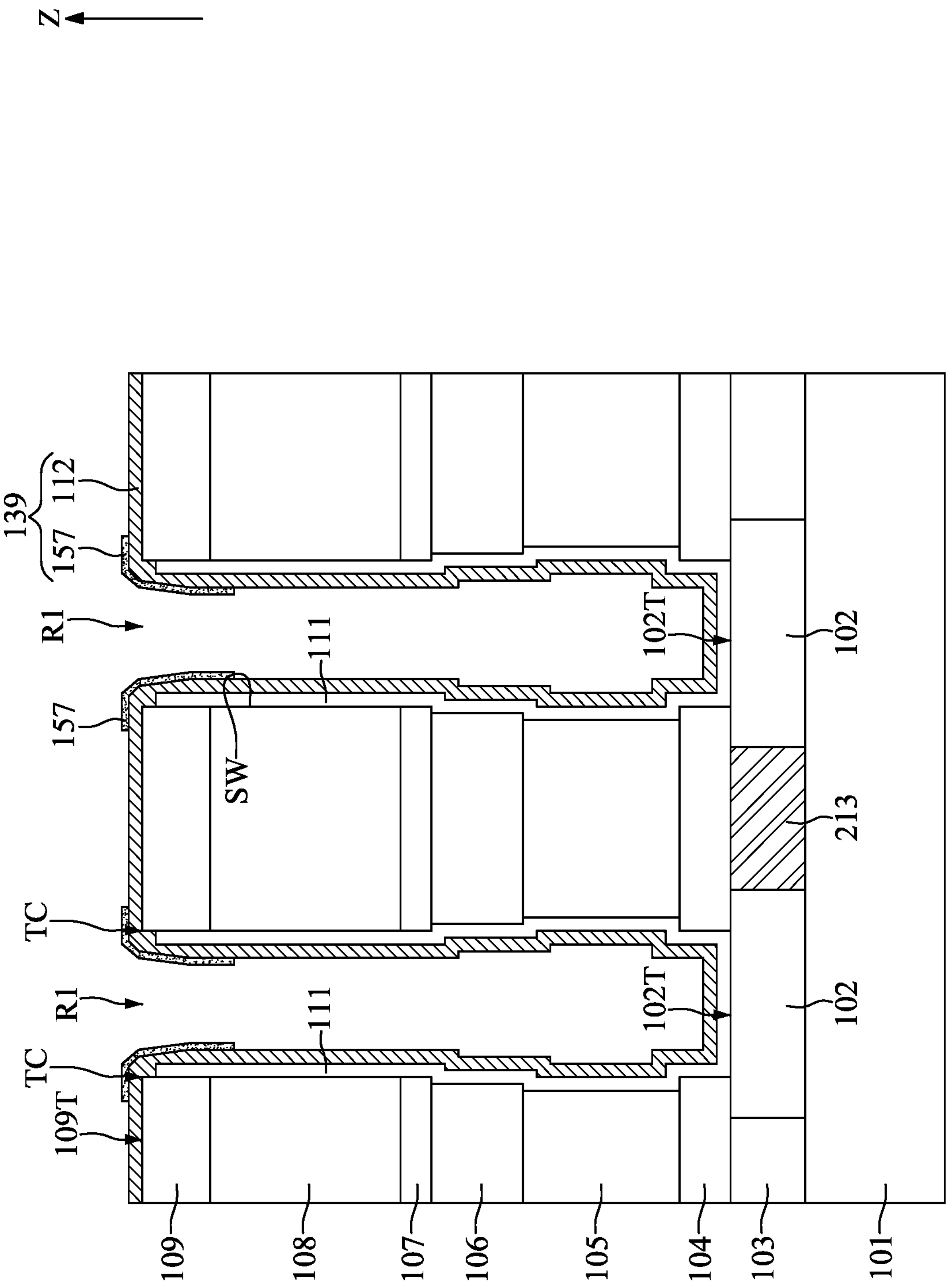

FIG. 21 is a cross-sectional diagram of an intermediate stage in the formation of a memory device in accordance with some embodiments of the present disclosure. In the operation S20, a plurality of dielectric portions 157 are deposited over the dielectric layer 112 and at the top corners TC of the plurality of first recesses R1. In some embodiments, the dielectric layer 112 and the plurality of dielectric portions 157 are collectively referred to the dielectric structure 139. It should be noted that the plurality of dielectric portions 157 are formed by a deposition process having a lower step coverage than the deposition process used for forming the dielectric layer 112. In some embodiments, the plurality of dielectric portions 157 are formed by a non-conformal deposition process, such as a non-conformal liner atomic layer deposition (NOLA) process.

After the plurality of dielectric portions 157 are formed, a portion of the dielectric layer 112 covering the top surface 109T of the third support layer 109 and a portion of the dielectric layer 112 in the plurality of first recesses R1 are exposed. In some embodiments, the dielectric layer 112 has a portion sandwiched between the plurality of dielectric portions 157 and the third support layer 109, and another portion sandwiched between the plurality of dielectric portions 157 and the plurality of bottom electrodes 111. In some embodiments, the plurality of dielectric portions 157 include silicon oxide, silicon nitride, silicon oxynitride, a dielectric material with high dielectric constant (high-k), or a combination thereof.

The plurality of dielectric portions 157 are formed to prevent the corner effect, which incur uneven thickness of the dielectric layer 112. For example, the thickness of the dielectric layer 112 at the top corners TC of the plurality of first recesses R1 is less than that of other portions of the dielectric layer 112. By forming the plurality of dielectric portions 157 over the dielectric layer 112, the overall thickness of the dielectric structure 139 at the top corners TC of the plurality of first recesses R1 may be increased, which prevent or reduce leakage current between the plurality of bottom electrodes 111 and the subsequently formed top electrode.

Figure 22:
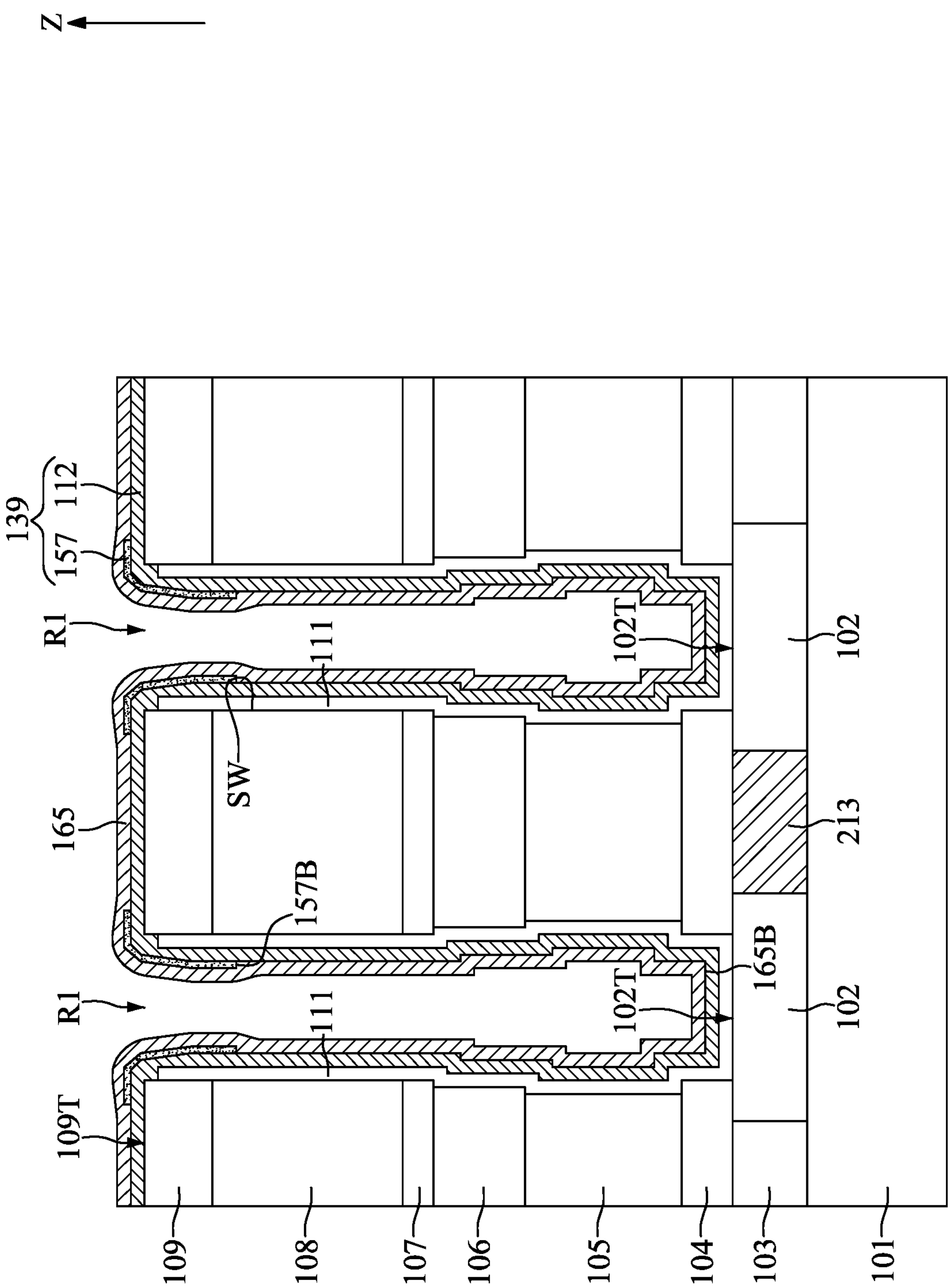

FIG. 22 is a cross-sectional diagram of an intermediate stage in the formation of a memory device in accordance with some embodiments of the present disclosure. In the operation S21, a top conductive layer 165 is formed over the dielectric structure 139. In some embodiments, the top conductive layer 165 is conformally deposited to cover the dielectric layer 112 and the dielectric portions 157 of the dielectric structure 139.

Detailedly, the top conductive layer 165 extends along the top surface 109T of the third support layer 109, the sidewalls SW of the plurality of first recesses R1 and the top surfaces 102T of the plurality of landing areas 102. In some embodiments, the remaining portion of the plurality of first recesses R1 is not formed by the top electrode 165. That is, a portion of the plurality of first recesses R1 located above the top conductive layer 165. In some embodiments, the upper portion of the top conductive layer 165 in the plurality of first recesses R1 is in direct contact with the dielectric portions 157 and the lower portion of the top conductive layer 165 in the plurality of first recesses R1 is in direct contact with the dielectric layer 112. Moreover, since the dielectric portions 157 of the dielectric structure 139 do not extend to the bottommost portion of the plurality of first recesses R1, the bottommost surface 157B of each of the dielectric portions 157 is higher than the bottommost surface 165B of the top conductive layer 165.

In some embodiments, the top conductive layer 165 includes titanium nitride (TiN), titanium silicon nitride (TiSiN), or a combination thereof. In some embodiments, the top conductive layer 165 is formed by a deposition process, such as a CVD process or an ALD process.

Figure 23:
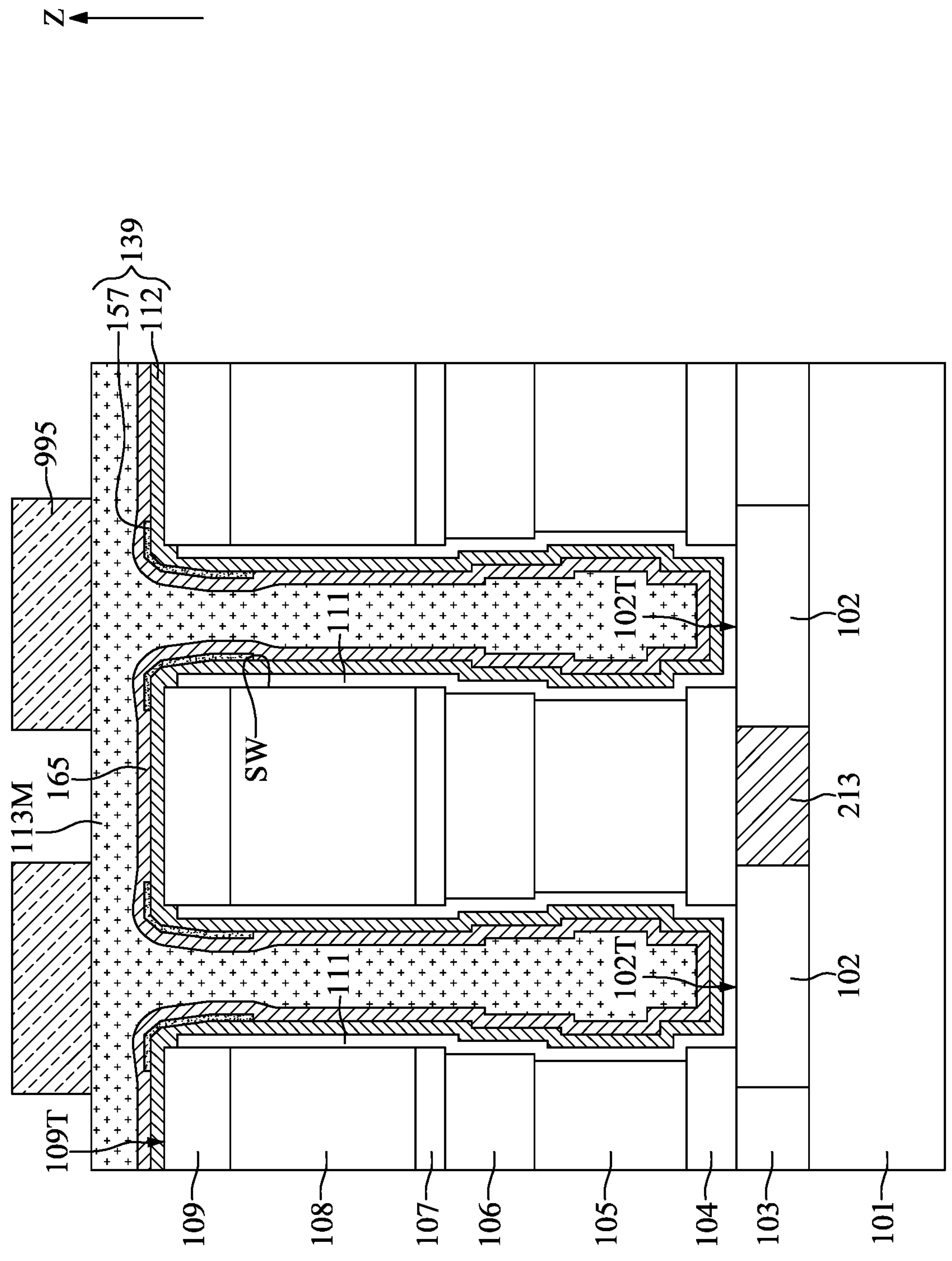

FIG. 23 is a cross-sectional diagram of an intermediate stage in the formation of a memory device in accordance with some embodiments of the present disclosure. A top electrode material layer 113M is formed in the plurality of first recesses R1. The top electrode material layer 113M may include TiN and can be formed by a plating operation or another type of deposition operation. In some embodiments, a portion of the top electrode material layer 113M is above the third support layer 109. A second mask layer 995 is formed on the top electrode material layer 113M. The second mask layer 995 is a photoresist layer and has a pattern covering portions of the top electrode material layer 113M. The covered portions of the top electrode material layer 113M are disposed over the plurality of plurality of landing areas 102, respectively and correspondingly.

Figure 24:
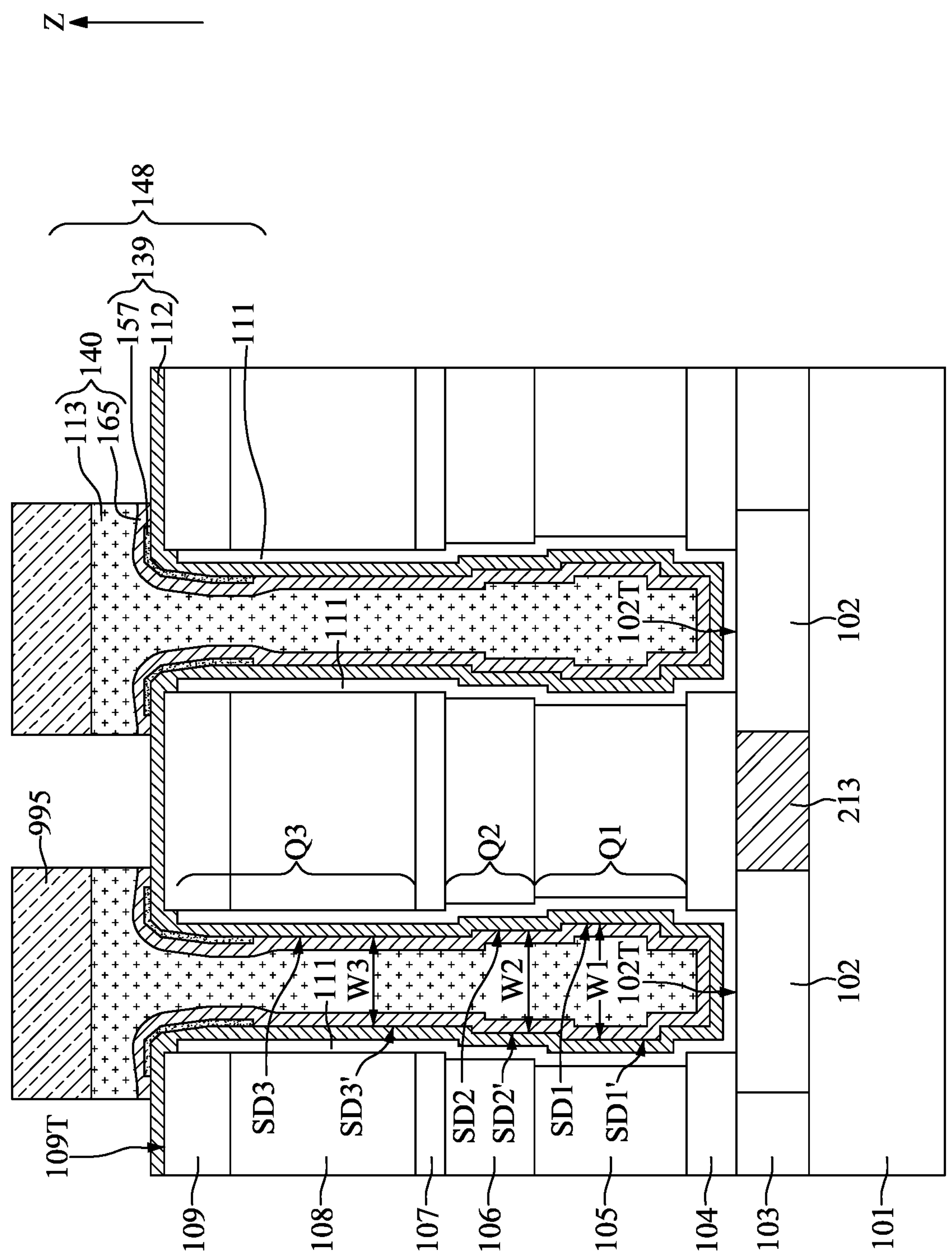

FIG. 24 is a cross-sectional diagram of an intermediate stage in the formation of a memory device in accordance with some embodiments of the present disclosure. In the operation S21, a plurality of top electrodes 113 are formed over the plurality of first recesses R1 by performing a dry etch operation using the second mask layer 995 as the mask. The dry etch operation may stop at the dielectric layer 112. The top conductive layer 165 is separated into multiple portions and is referred to as the plurality of top conductive layers 165. The top electrode material layer 113M is separated into multiple portions and is referred to as the plurality of top electrodes 113. The plurality of top conductive layers 165 and the plurality of top electrodes 113 are collectively referred to the plurality of top electrode structures 140. The plurality of bottom electrodes 111, the dielectric structure 139, and the plurality of top electrode structures 140 are collectively referred to the plurality of capacitance structures 148. After the formation of the capacitance structures 148, the second mask layer 995 is removed.

In some embodiments, each of the plurality of top electrode structures 140 of the plurality of capacitance structures 148 has a lower portion Q1 laterally surrounded by the first material layer 105, a middle portion Q2 laterally surrounded by the second material layer 106, and an upper portion Q3 laterally surrounded by the third material layer 108 and the third support layer 109. The lower portion Q1 has a first width W1 measured from a first inner sidewall SD1 of the top electrode structure 140 to a second inner sidewall SD1' of the top electrode structure 140, the middle portion Q2 has a second width W2 measured from a third inner sidewall SD2 of the top electrode structure 140 to a fourth inner sidewall SD2' of the top electrode structure 140, and the upper portion Q3 has a third width W3 measured from a fifth inner sidewall SD3 of the top electrode structure 140 to a sixth inner sidewall SD3' of the top electrode structure 140.

In some embodiments, the first width W1 is greater than the second width W2. In some embodiments, the second width W2 is greater than the third width W3. In some embodiments, the first width W1 is greater than either the second width W2 or the third width W3.

In some alternative embodiments, the third width W3 is comparable to the second width W2, and the second width W2 is comparable to the first width W1.

Figure 25:
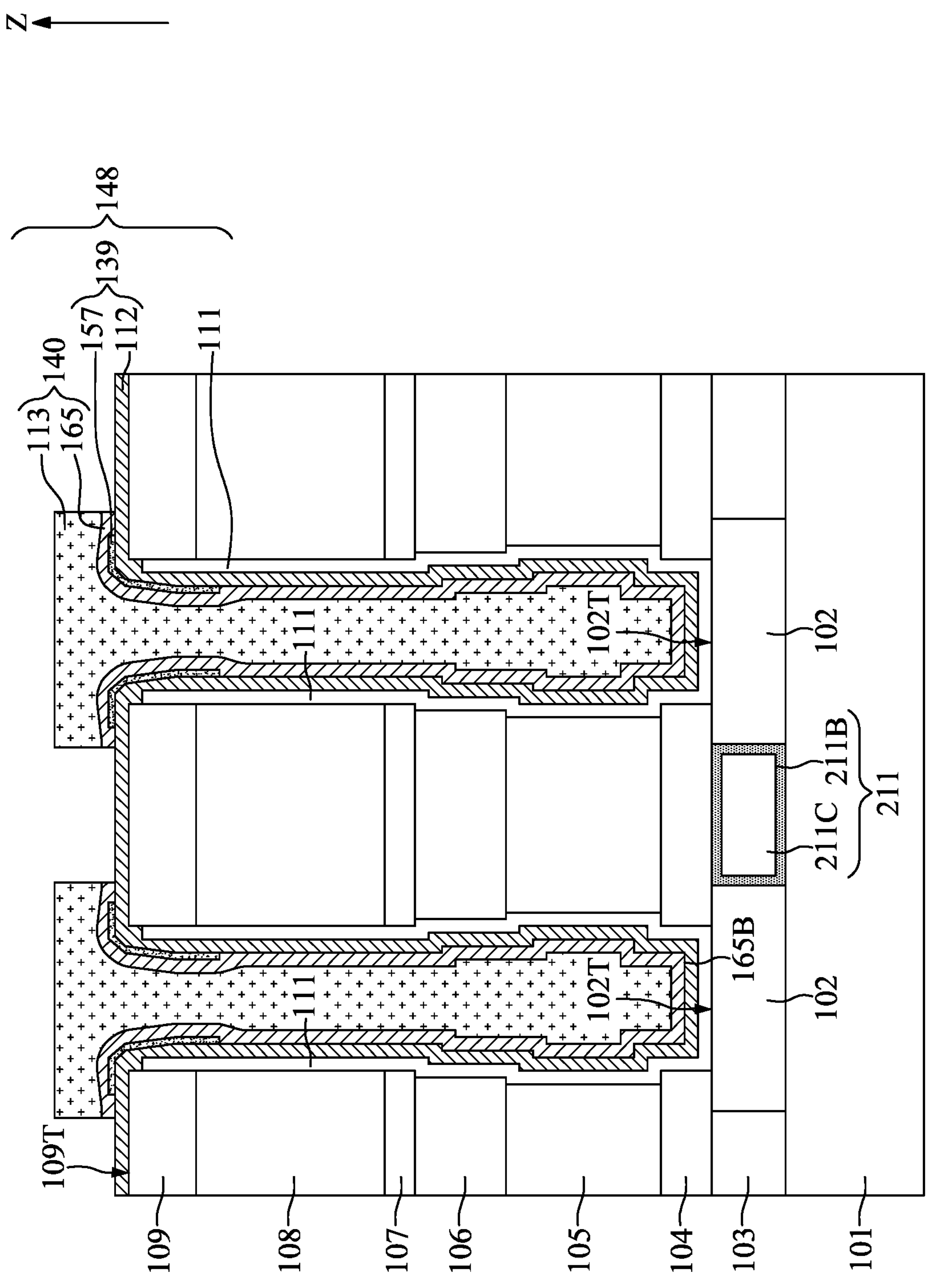

FIG. 25 is a cross-sectional diagram of an intermediate stage in the formation of a memory device in accordance with some embodiments of the present disclosure. In the operation S22, an air gap structure 211 is formed between the plurality of landing areas 102 by performing a thermal treating process. In some embodiments, during the thermal treating process, the remaining energy-removable layer 213 is transformed into the air gap structure 211 including an air gap 211C enclosed by a liner 211B.

In some embodiments, the air gap structure 211 is sealed by the first support layer 104, and a portion of the first support layer 104 extends into the space between the plurality of landing areas 102. In other words, the top surface of the air gap structure 213 is lower than the top surfaces 102T of the plurality of landing areas 102 (not shown). The presence of the air gap structure 211 can reduce the parasitic capacitance between the plurality of landing areas 102.

Figure 26:
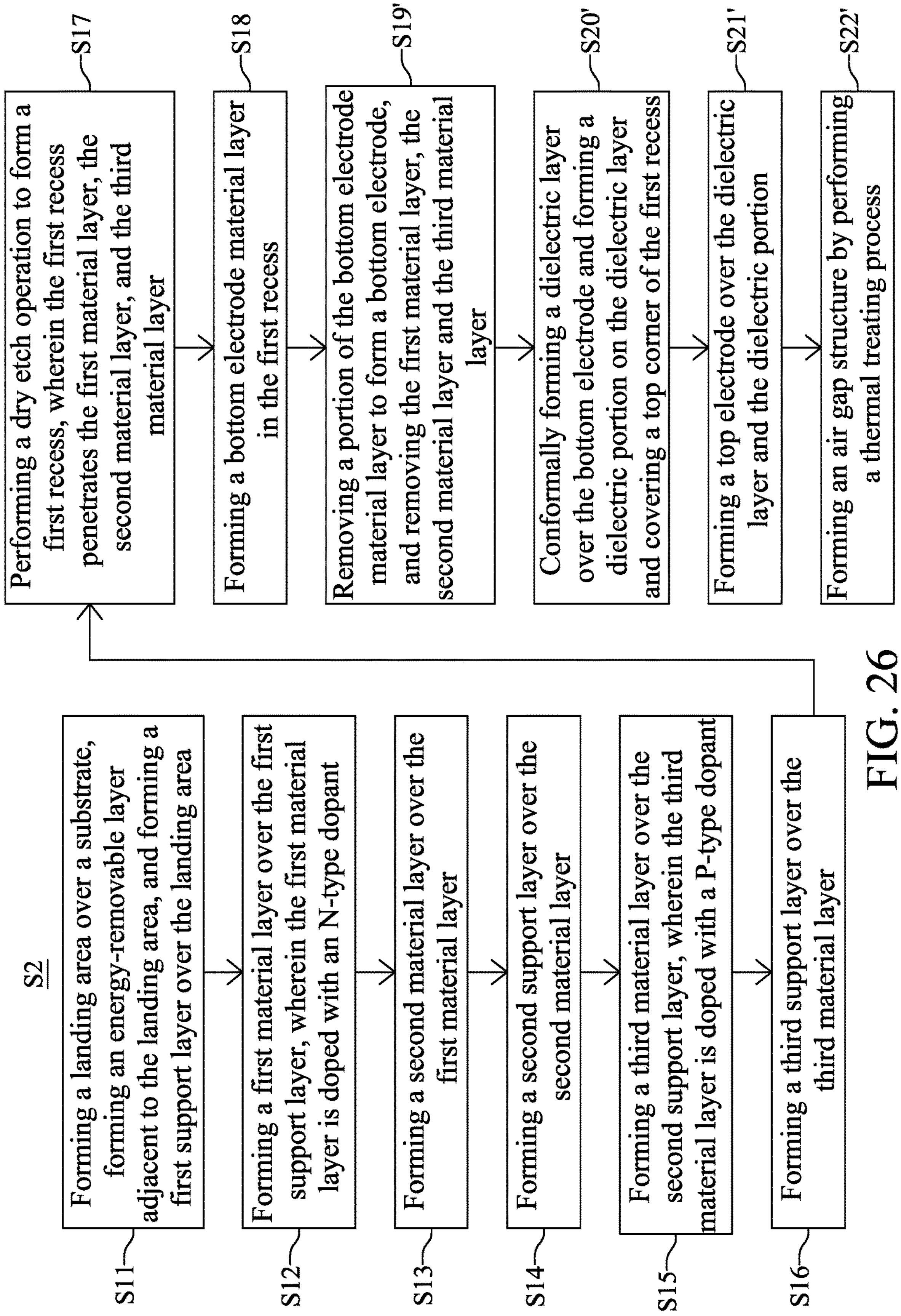
FIG. 26 is a flow diagram illustrating a method of manufacturing a memory device in accordance with some embodiments of the present disclosure.

FIG. 26 is a flow diagram illustrating a method of manufacturing a memory device in accordance with some embodiments of the present disclosure. The method S2 includes a number of operations (S11, S12, S13, S14, S15, S16, S17, S18, S19', S20', S21', and S22') and the description and illustration are not deemed as a limitation to the sequence of the operations. In the operation S11, a landing area is formed over a substrate, an energy-removable layer is formed adjacent to the landing area, and a first support layer is formed over the landing area. In the operation S12, a first material layer is formed over the first support layer, wherein the first material layer is doped with an N-type dopant. In the operation S13, a second material layer is formed over the first material layer. In the operation S14, a second support layer is formed over the second material layer. In the operation S15, a third material layer is formed over the second support layer, wherein the third material layer is doped with a P-type dopant. In the operation S16, a third support layer is formed over the third material layer. In the operation S17, a dry etch operation is performed to form a first recess, wherein the first recess penetrates the first material layer, the second material layer, and the third material layer. In the operation S18, a bottom electrode material layer is formed in the first recess. In the operation S19', a portion of the bottom electrode material layer is removed to form a bottom electrode, and the first material layer, the second material layer and the third material layer are removed. In the operation S20', a dielectric layer is conformally formed over the bottom electrode and a dielectric portion is formed on the dielectric layer and covering a top corner of the first recess. In the operation S21', a top electrode is formed over the dielectric layer and the dielectric portion. In the operation S22', an air gap structure is formed by performing a thermal treating process.

FIGS. 1 to 15 and 27 to 34 are schematic diagrams illustrating various fabrication stages constructed according to the method S2 in accordance with some embodiments of the present disclosure.

After performing operations S11 to S18 as depicted in FIGS. 1 to 15, operations S19' to S22' are performed, as will be depicted in FIGS. 27 to 34.

Figure 27:
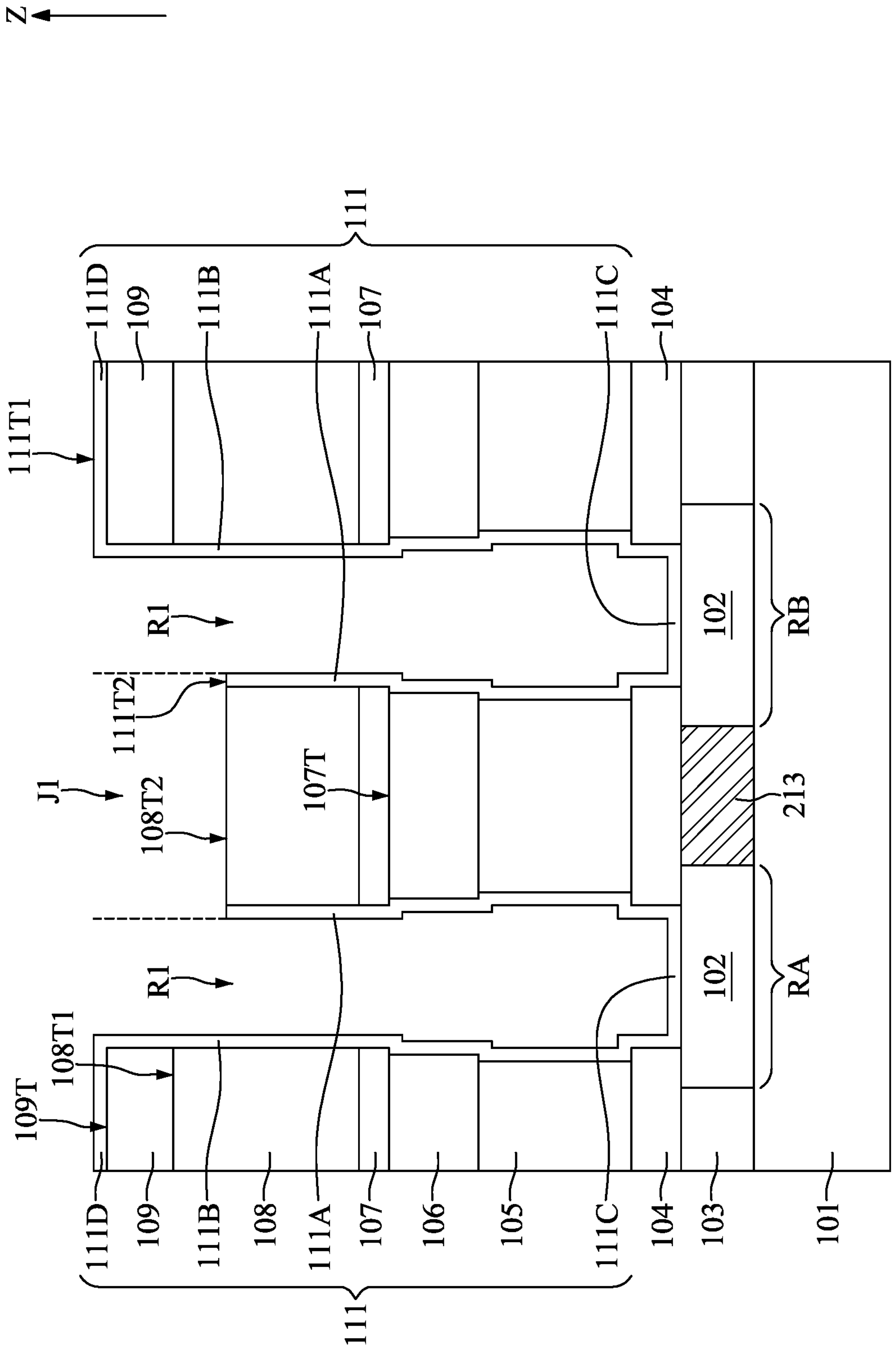
FIGS. 27 is a cross-sectional diagram of an intermediate stage in the formation of the memory device in accordance with some embodiments of the present disclosure.
Figure 28:
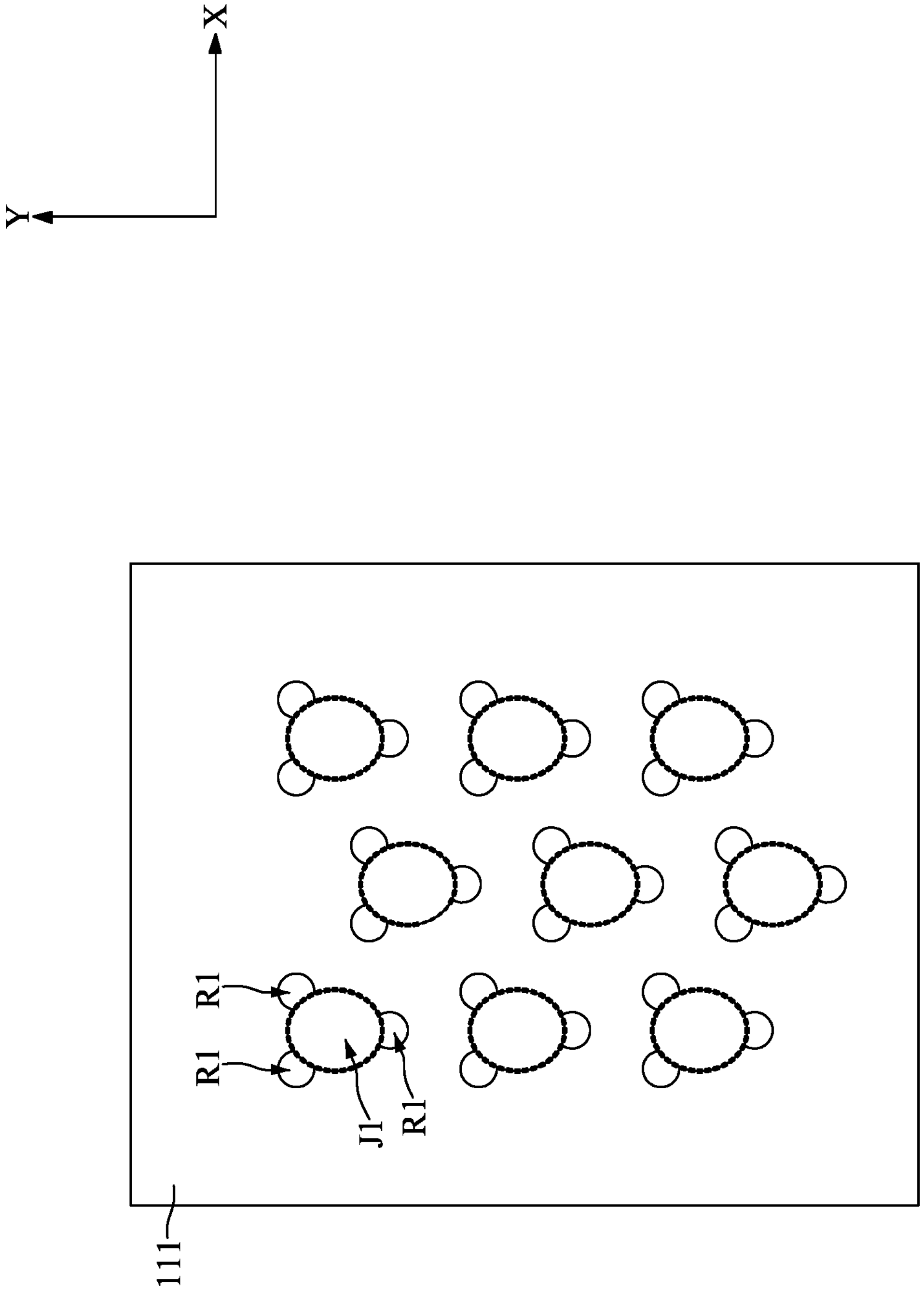
FIG. 28 is a top view perspective schematic diagram of an intermediate stage in the formation of the memory device shown in FIG. 27 in accordance with some embodiments of the present disclosure.

FIG. 27 is a cross-sectional diagram of an intermediate stage in the formation of a memory device in accordance with some embodiments of the present disclosure, and FIG. 28 is a top view perspective schematic diagram of an intermediate stage in the formation of the memory device shown in FIG. 27 in accordance with some embodiments of the present disclosure. In the operation S19', a cutoff region J1 is defined by a lithography operation, wherein the cutoff region J1 connects to at least two first recesses R1. In some embodiments, each cutoff region J1 connects to three first recesses R1, as depicted in FIG. 28. Further, an etching operation is performed to remove a portion of the third material layer 108, a portion of the third support layer 109, and an upper portion of the bottom electrode material layer 111M (depicted in FIG. 15) over the cutoff region J1. In some embodiments, the etching operation stops at a position in the third material layer 108, or, alternatively stated, the etching operation stops at a position above a top surface 107T of the second support layer 107. After such etching operation, a remaining portion of the third material layer 108 in the cutoff region J1 has a top surface 108T2 lower than the top surface 108T1 of the third material layer 108 that is outside of the cutoff region J1.

The bottom electrode material layer 111M is separated into multiple portions after the etching operation, thereby forming multiple bottom electrodes 111 over each landing area 102. For example, one bottom electrode 111 is formed over the first region RA, and another bottom electrode 111 is formed over the second region RB. Each bottom electrode 111 has a container-shaped profile.

The bottom electrode 111 includes a first wall portion 111A extending upward and adjacent to the cutoff region J1; a second wall portion 111B extending upward and positioned on a side away from the first wall portion 111A; a bottom portion 111C over the landing area 102; and a top portion 111D extending over the third support layer 109.

The first wall portion 111A has a top surface 111T2 lower than the top surface 108T1 of the third material layer 108. The top surface 111T2 is lower than the top surface 111T1 of the top portion 111D of the bottom electrode 111. In some embodiments, the top surface 111T2 is level with the top surface 108T2. A cleaning operation can be performed to remove residues generated during the etching operation.

Figure 29:
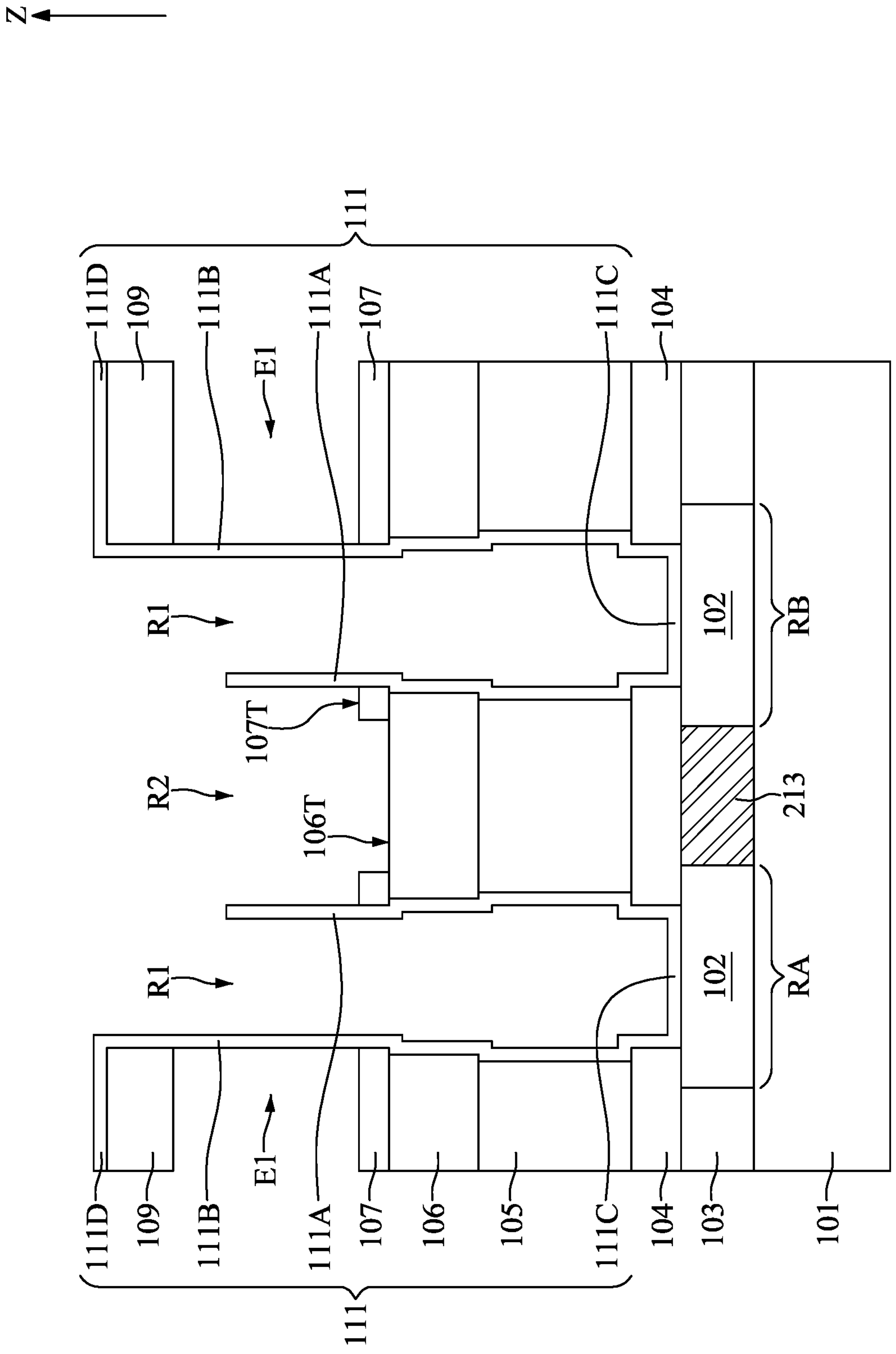
FIGS. 29 to 34 are cross-sectional diagrams of intermediate stages in the formation of the memory device in accordance with some embodiments of the present disclosure.

FIG. 29 is a cross-sectional diagram of an intermediate stage in the formation of a memory device in accordance with some embodiments of the present disclosure. In the operation S19', the third material layer 108 is removed by a removal operation. In some embodiments, the removal operation includes applying $NF_3$ and $H_2$, along with an application of plasma, over the third material layer 108.

The removal operation has an etch rate on Si significantly greater than an etch rate on SiN; for example, around 2000:1. Further, when the targeted layer to be etched is partially covered by SiN, the aforesaid etching recipe is an effective operation. After the removal operation is performed, the third support layer 109 remains adhered to the bottom electrode 111 and overhangs the second support layer 107. In some embodiments, the third support layer 109 is attached to the second wall portion 111B and the top portion 111D of the bottom electrode 111.

The top surface 107T of the second support layer 107 is exposed, and an empty space E1 is formed between the second support layer 107 and the third support layer 109.

After the removal operation, a punch-through operation is performed to remove a portion of the second support layer 107 in the cutoff region J1. Therefore, a second recess R2 is formed in the second support layer 107, and a top surface 106T of the second material layer 106 is exposed through the second recess R2. The second recess R2 is positioned between the first wall portions 111A of a plurality of the bottom electrodes 111.

Figure 30:
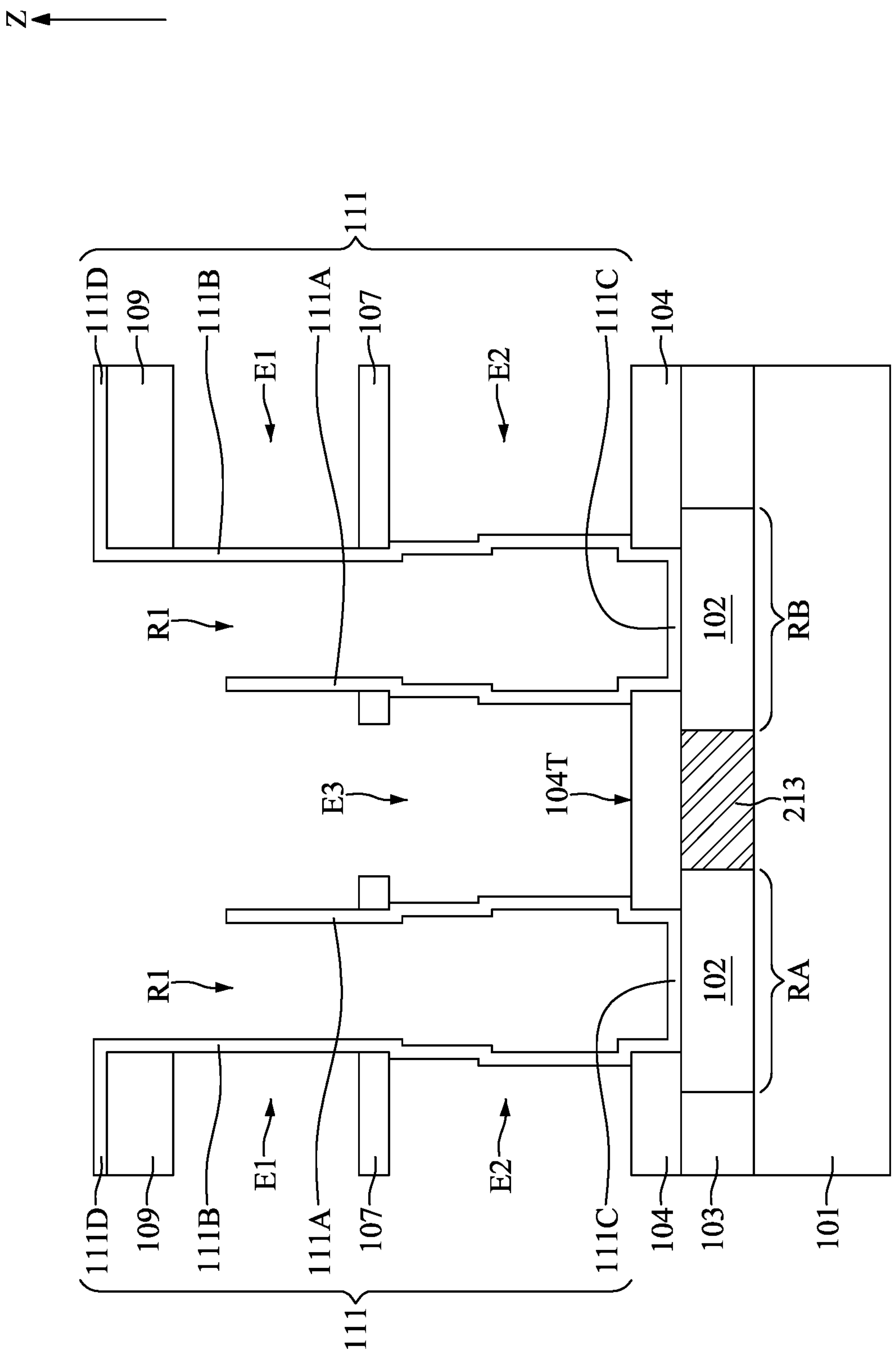

FIG. 30 is a cross-sectional diagram of an intermediate stage in the formation of a memory device in accordance with some embodiments of the present disclosure. In the operation S19', the first material layer 105 and the second material layer 106 are removed by a removal operation. In some embodiments, the removal operation includes applying $NF_3$ and $H_2$, along with an application of plasma, over the first material layer 105 and the second material layer 106. Such removal operation has an etch rate on Si significantly greater than an etch rate on SiN, for example, around 2000:1. After performing the removal operation, the second support layer 107 remains adhered to the bottom electrode 111 and overhangs the first support layer 104. In some embodiments, the etching chemical enters through the second recess R2 depicted in FIG. 29. In some embodiments, the second support layer 107 is attached to the second wall portion 111B of the bottom electrode 111. The top surface 104T of the first support layer 104 is exposed. An empty space E2 is formed between the first support layer 104 and the second support layer 107. An empty space E3 is formed between the first wall portions 111A of the plurality of bottom electrodes 111.

In summary, in the operation S19', a portion of the bottom electrode material layer 111M is removed to form the bottom electrode 111, and the first material layer 105, the second material layer 106, and the third material layer 108 are removed. The first support layer 104, the second support layer 107, the third support layer 109, and the bottom electrodes 111 remain in place.

Figure 31:
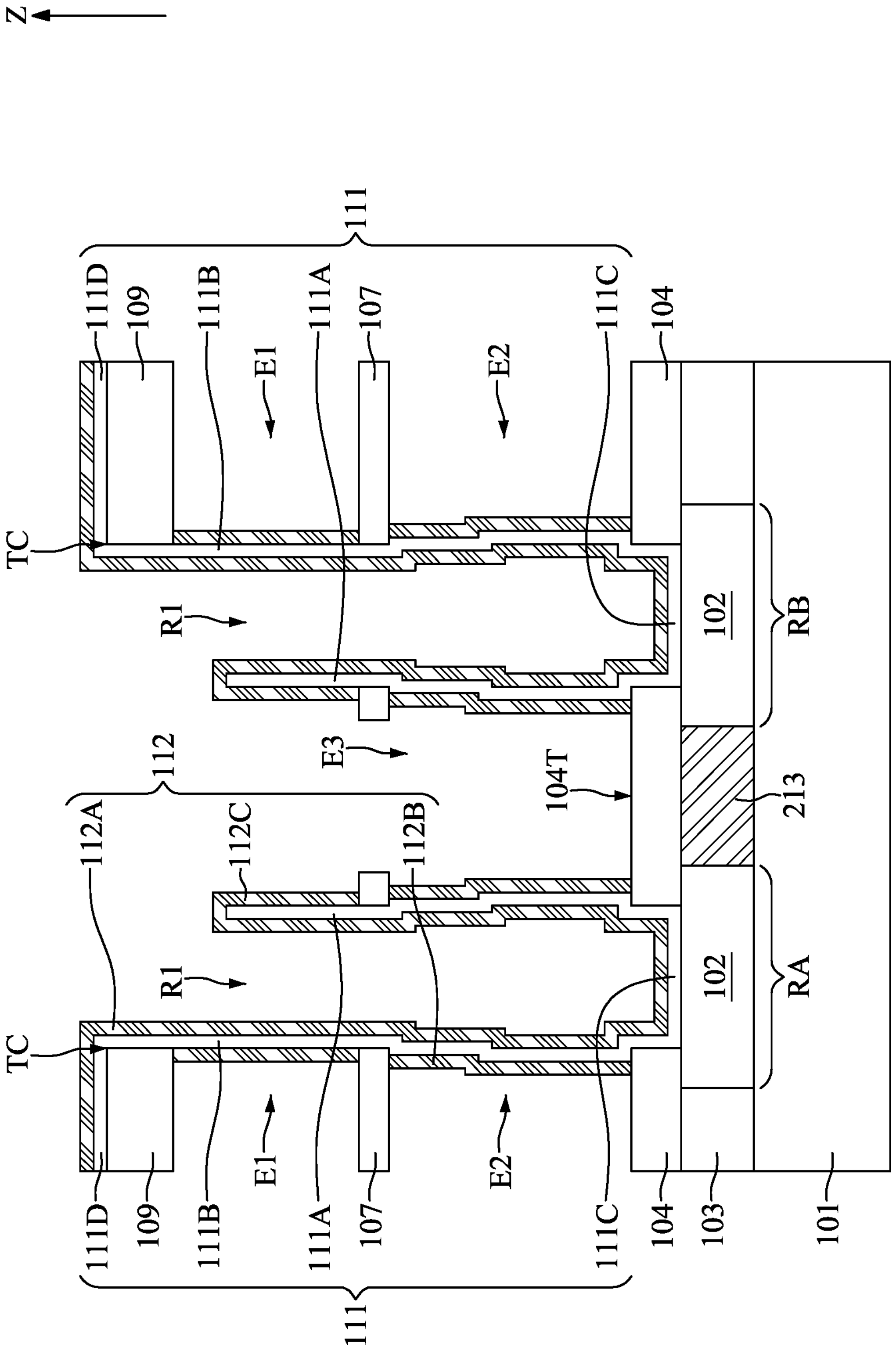

FIG. 31 is a cross-sectional diagram of an intermediate stage in the formation of a memory device in accordance with some embodiments of the present disclosure. In the operation S20', a plurality of dielectric layers 112 are conformally formed over an exposed area of the bottom electrodes 111. Each of the plurality of dielectric layers 112 includes a first part 112A on a side of the bottom electrode 111 proximal to the first recess R1, a second part 112B on an opposite side of the second wall portion 111B (which is proximal to the empty space E1 and the empty space E2), and a third part 112C proximal to the empty space E3. Moreover, in some embodiments, the top corners TC of the plurality of first recesses R1 are also covered by the plurality of dielectric layer 112.

In some embodiments, each of the plurality of dielectric layers 112 includes a single layer or multiple layers. In some embodiments, each of the plurality of dielectric layers 112 includes $SiO_2$, a dielectric material with high dielectric constant (high-k), such as $ZrO_2$, $HfO_2$, $TiO_2$, AlO, or a combination thereof. For example, each of the plurality of dielectric layers 112 may be a tri-layer structure including two layers of aluminum oxide and a layer of zirconium oxide disposed between them. Moreover, in some embodiments, the plurality of dielectric layers 112 are formed by a conformal deposition process, such as an ALD process.

Figure 32:
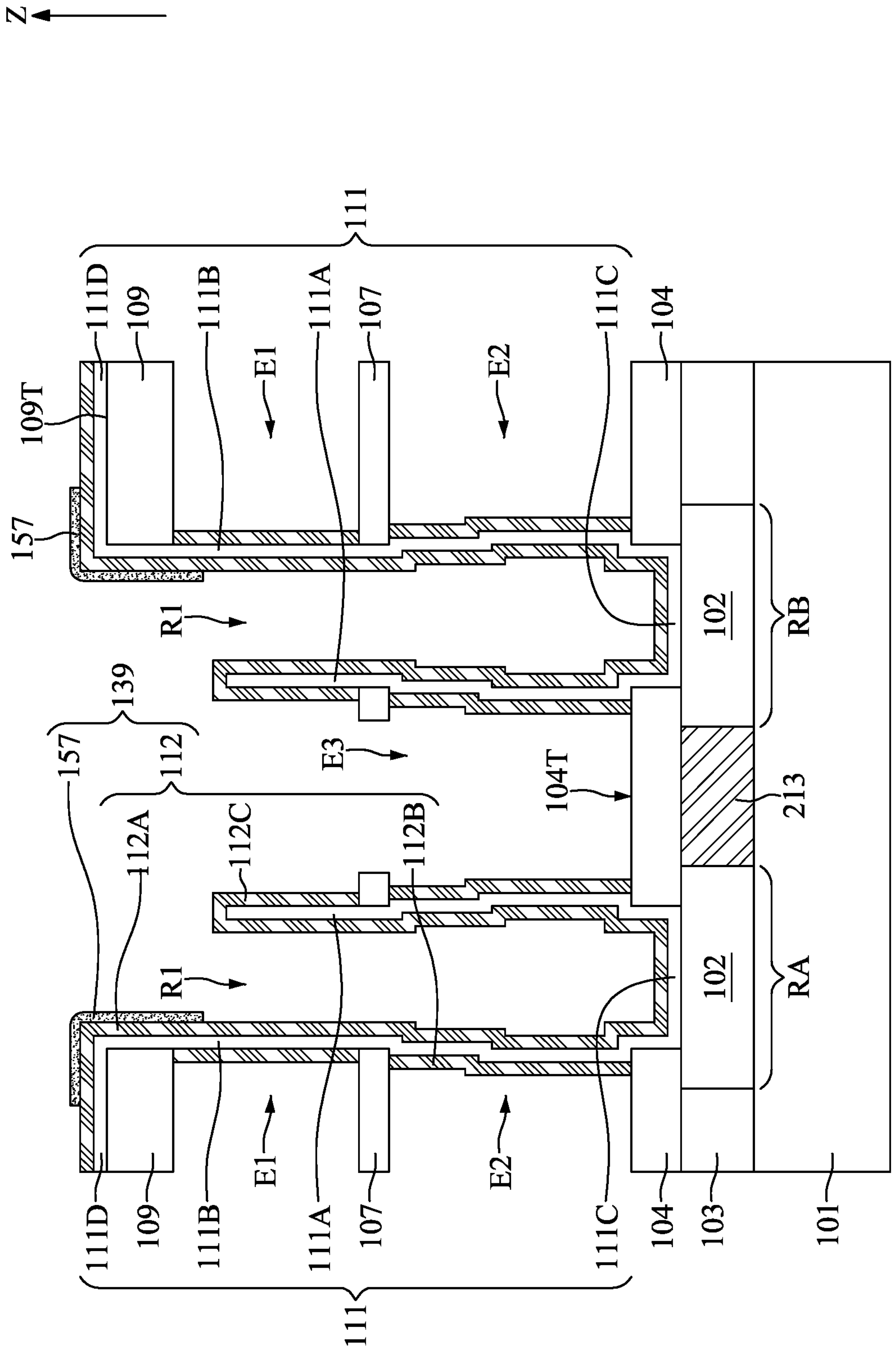

FIG. 32 is a cross-sectional diagram of an intermediate stage in the formation of a memory device in accordance with some embodiments of the present disclosure. In the operation S20', a plurality of dielectric portions 157 are deposited over the plurality of dielectric layers 112 and at the top corners TC of the plurality of first recesses R1, respectively and correspondingly. In some embodiments, the plurality of dielectric layers 112 and the plurality of dielectric portions 157 are collectively referred to the plurality of dielectric structures 139. It should be noted that the plurality of dielectric portions 157 are formed by a deposition process having a lower step coverage than the deposition process used for forming the plurality of dielectric layers 112. In some embodiments, the plurality of dielectric portions 157 are formed by a non-conformal deposition process, such as a non-conformal liner atomic layer deposition (NOLA) process.

For brevity, clarity, and convenience of description, only one dielectric structure 139 is described. After the dielectric portion 157 is formed, a portion of the first part 112A of the dielectric layer 112 are covered by the dielectric portion 157. Detailedly, the first part 112A of the dielectric layer 112 has a portion sandwiched between the dielectric portion 157 and the top portion 111D and has another portion sandwiched between the dielectric portion 157 and the second wall portion 111B. In some embodiments, the dielectric portion 157 includes silicon oxide, silicon nitride, silicon oxynitride, a dielectric material with high dielectric constant (high-k), or a combination thereof.

The dielectric portion 157 is formed to prevent the corner effect, which incur uneven thickness of the dielectric layer 112. By forming the dielectric portion 157 over the dielectric layer 112, the overall thickness of the dielectric structure 139 at the top corners TC of the first recess R1 may be increased, which prevent or reduce leakage current between the plurality of bottom electrodes 111 and the subsequently formed top electrode.

Figure 33:
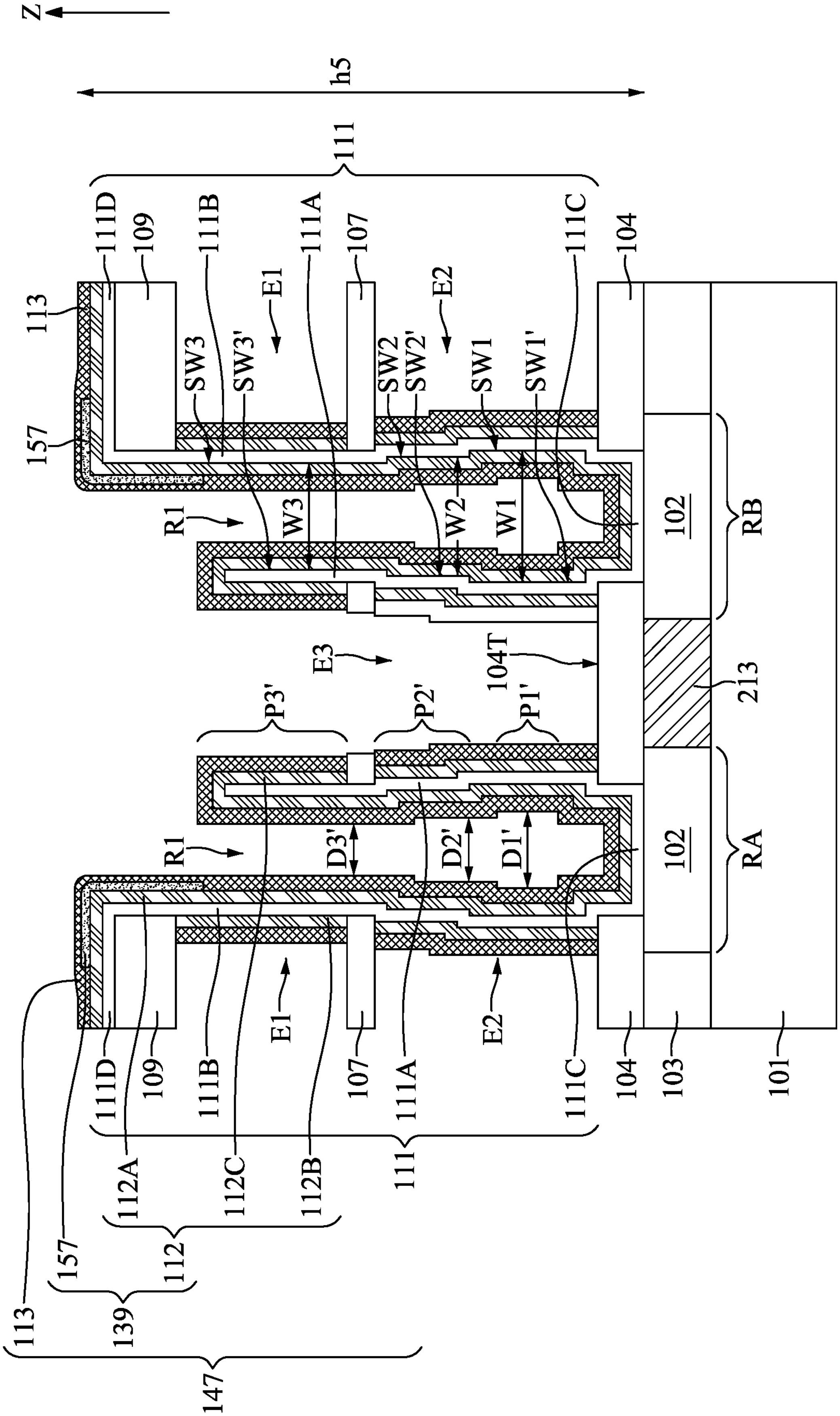

FIG. 33 is a cross-sectional diagram of an intermediate stage in the formation of a memory device in accordance with some embodiments of the present disclosure. In the operation S21', a plurality of top electrodes 113 are conformally formed over the plurality of dielectric structures 139, respectively and correspondingly. In some embodiments, the plurality of top electrodes 113 may include TiN, and can be formed by an atomic layer deposition operation.

One set of the top electrode 113, the bottom electrode 111, and the dielectric structure 139 is collectively referred to as a container structure 147. The container structure 147 can also be referred to as a double side container, wherein the top electrode 113 is formed over two sides of one bottom electrode 111.

One container structure 147 has a lower portion P1', a middle portion P2' above the lower portion P1', and an upper portion P3' above the middle portion P2'. The first recess R1 defined by one container structure 147 has a dimension D1' at a level of the lower portion P1', a dimension D2' at a level of the middle portion P2', and a dimension D3' at a level of the upper portion P3'. In some embodiments, the dimension D1' is greater than the dimension D2'. In some embodiments, the dimension D2' is greater than the dimension D3'. In some embodiments, the dimension D1' is greater than either the dimension D2' or the dimension D3'. The dimensions D1', D2' and D3' are maximum widths in a lateral direction of a corresponding empty space of the first recess R1.

In some alternative embodiments, the dimension D1' is comparable to the dimension D2', and the dimension D2' is comparable to the dimension D3'.

Further, the lower portion Pl' has a first width W1 measured from a first inner sidewall SW1 of the bottom electrode 111 to a second inner sidewall SW1' of the bottom electrode 111, the middle portion P2' has a second width W2 measured from a third inner sidewall SW2 of the bottom electrode 111 to a fourth inner sidewall SW2' of the bottom electrode 111, and the upper portion P3' has a third width W3 measured from a fifth inner sidewall SW3 of the bottom electrode 111 to a sixth inner sidewall SW3' of the bottom electrode 111.

In some embodiments, the first width W1 is greater than the second width W2. In some embodiments, the second width W2 is greater than the third width W3. In some embodiments, the first width W1 is greater than either the second width W2 or the third width W3.

In some alternative embodiments, the third width W3 is comparable to the second width W2, and the second width W2 is comparable to the first width W1.

In some embodiments, a total thickness h5 of the container structure 147 may be in a range from 0.8 μm to about 1.2 μm. The first recess R1 is laterally surrounded by the top electrode 113 and the bottom electrode 111.

Optionally, another insulation layer can be formed over the top electrode 113, but the present disclosure is not limited thereto.

As previously discussed, the container structure 147 has a profile that has a relatively wider bottom width (compared to a profile of the comparative embodiment depicted in FIG. 1); thus, it has a greater capacitance, which improves a device performance of the memory device.

Figure 34:
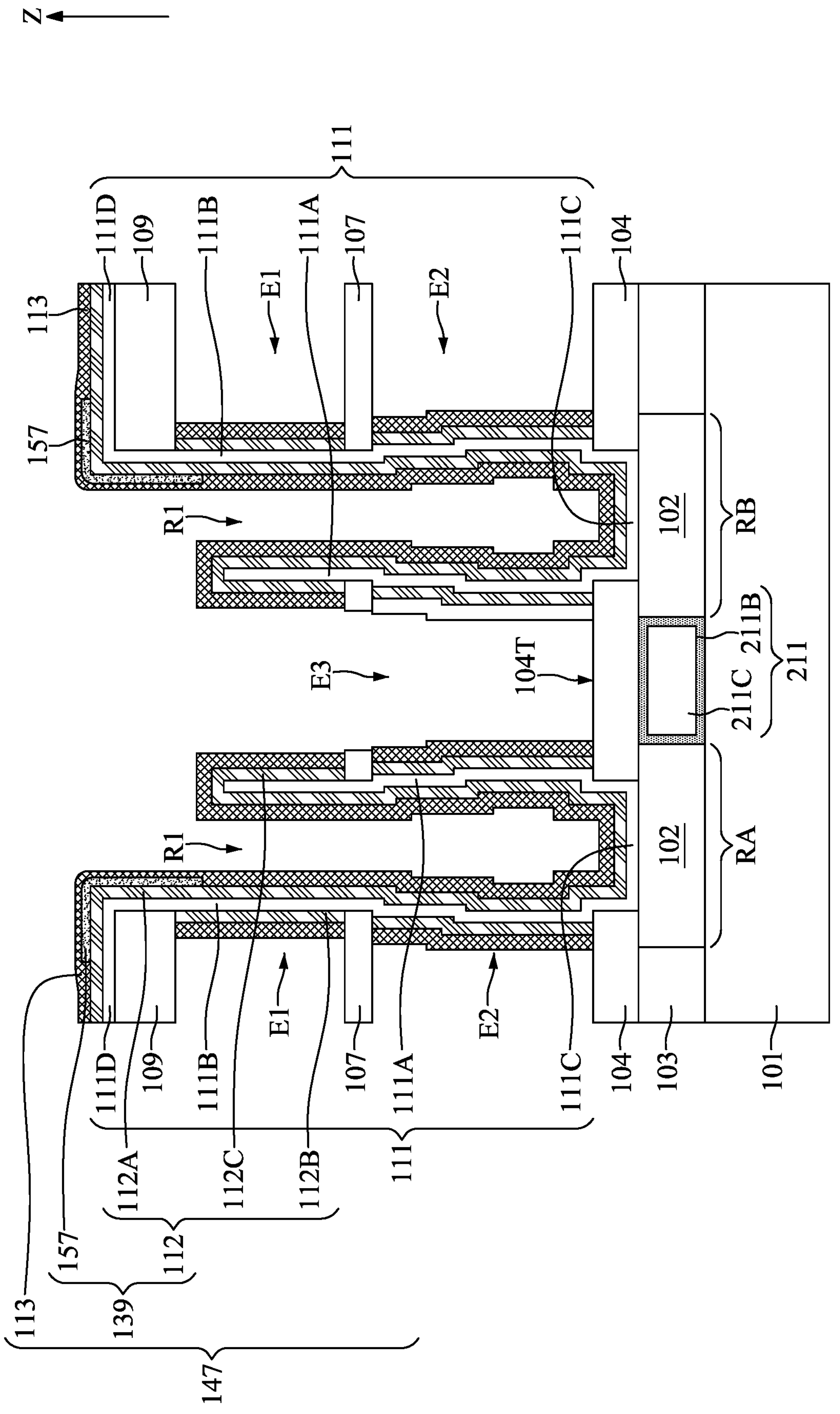

FIG. 34 is a cross-sectional diagram of an intermediate stage in the formation of a memory device in accordance with some embodiments of the present disclosure. In the operation S22', an air gap structure is formed between the plurality of landing areas 102 by performing a thermal treating process. In some embodiments, during the thermal treating process, the remaining energy-removable layer 213 is transformed into an air gap structure 211 including an air gap 211C enclosed by a liner 211B.

In some embodiments, the air gap structure 211 is sealed by the first support layer 104, and a portion of the first support layer 104 extends into the space between the plurality of landing areas 102. In other words, the top surface of the air gap structure 213 is lower than the top surfaces 102T of the plurality of landing areas 102 (not shown).

One aspect of the present disclosure provides a memory device including a substrate; a landing area positioned on the substrate; a bottom electrode positioned on the landing area, wherein the bottom electrode has a container-shaped profile; a support layer positioned over the substrate and laterally surrounded the bottom electrode; a dielectric structure including a dielectric layer conformally positioned on the bottom electrode and on a top surface of the support layer, and covering top corners of the support layer, and a plurality of dielectric portions conformally positioned on the dielectric layer and covering the top corners of the support layer; and a top electrode structure positioned on the dielectric structure. The plurality of dielectric portions are sandwiched by the top electrode structure and the dielectric layer. The top surface of the third support layer is higher than a top surface of the bottom electrode.

Another aspect of the present disclosure provides a memory device including a substrate; a landing area positioned on the substrate; a first support layer positioned on the substrate; a second support layer positioned over the first support layer; a third support layer positioned over the second support layer; a bottom electrode including a bottom portion horizontally positioned on the landing area, a first wall portion extending from the bottom portion along a first direction, a second wall portion extending from the bottom portion along the first direction and separated from the first wall portion, and a top portion connecting to the second wall portion, parallel to the bottom portion, and collectively covering a top corner of the third support layer with the second wall portion; a dielectric structure including a dielectric layer conformally positioned on the bottom electrode, and a dielectric portion positioned on the dielectric layer and covering the top corner of the third support layer; and a top electrode conformally positioned on the dielectric structure.

Another aspect of the present disclosure provides a method for fabricating a memory device including forming a landing area on a substrate; forming an energy-removable layer adjacent to the landing area; sequentially forming a first support layer, a first material layer, a second material layer, a second support layer, a third material layer, and a third support layer over the landing area, wherein the first material layer is doped with an N-type dopant and the third material layer is doped with a P-type dopant; forming a first recess to expose the landing area; forming a bottom electrode within the first recess; conformally forming a dielectric layer on the bottom electrode and on a top surface of the third support layer; forming a plurality of dielectric portions on top corners of the first recess; and conformally forming a top conductive layer on the dielectric layer and covering the plurality of dielectric portions; and forming a top electrode on the top conductive layer.

Due to the design of the memory device of the present disclosure, the overall thickness of the dielectric structure 139 at the top corner TC of the third support layer 109 is increased. As a result, the leakage current between the bottom electrode 111 and the top electrode structure 140 can be prevented or reduced. In addition, the first width W1 of the lower portion Q1 of the top electrode structure 140 is greater than the third width W3 of the upper portion Q3 of the top electrode structure 140. Consequently, the capacitance of the capacitor structure 148 can be improved. Furthermore, the air gap structure 211 positioned between the plurality of landing areas 102 can reduce the parasitic capacitance between the plurality of landing areas 102.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A memory device, comprising:

a substrate;

a landing area positioned on the substrate;

a bottom electrode positioned on the landing area, wherein the bottom electrode has a container-shaped profile;

a support layer positioned over the substrate and laterally surrounded the bottom electrode;

a dielectric structure comprising:

a dielectric layer conformally positioned on the bottom electrode and on a top surface of the support layer, and covering top corners of the support layer; and a plurality of dielectric portions conformally positioned on the dielectric layer and covering the top corners of the support layer; and a top electrode structure positioned on the dielectric structure;

wherein the plurality of dielectric portions are sandwiched by the top electrode structure and the dielectric layer;

wherein the top surface of the support layer is higher than a top surface of the bottom electrode;

wherein the top electrode structure comprises:

a top conductive layer conformally positioned on the dielectric structure and covering the top corners of the support layer; and a top electrode positioned on the top conductive layer.

2. The memory device of claim 1, wherein the top electrode structure comprises:

a lower portion positioned over the landing area, wherein the lower portion has a first width measured from a first inner sidewall of the lower portion to a second inner sidewall of the lower portion;

a middle portion positioned over the lower portion, wherein the middle portion has a second width measured from a third inner sidewall of the middle portion to a fourth inner sidewall of the middle portion; and an upper portion positioned over the middle portion, wherein the upper portion has a third width measured from a fifth inner sidewall of the upper portion to a sixth inner sidewall of the upper portion.

3. The memory device of claim 2, wherein the first width is greater than the second width.

4. The memory device of claim 2, wherein the second width is greater than the third width.

5. The memory device of claim 2, wherein the first width is greater than the third width.

6. The memory device of claim 2, wherein the dielectric layer and the plurality of dielectric portions comprise the same material.

7. The memory device of claim 2, wherein the top conductive layer and the top electrode comprise the same material.

8. The memory device of claim 2, wherein the dielectric layer comprises a high-k dielectric material.

9. The memory device of claim 2, wherein the top conductive layer comprises titanium nitride, titanium silicon nitride, or a combination thereof.

10. The memory device of claim 2, wherein the support layer comprises silicon nitride.

11. The memory device of claim 2, wherein the bottom electrode comprises titanium nitride.

12. The memory device of claim 2, further comprising an air gap structure comprising:

an air gap positioned adjacent to the landing area; and a liner enclosing the air gap.

* * * * *